United States Patent
Fujii

(10) Patent No.: US 6,593,792 B2
(45) Date of Patent: Jul. 15, 2003

(54) BUFFER CIRCUIT BLOCK AND DESIGN METHOD OF SEMICONDUCTOR INTEGRATED CIRCUIT BY USING THE SAME

(75) Inventor: Toru Fujii, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/864,025

(22) Filed: May 23, 2001

(65) Prior Publication Data

US 2001/0048333 A1 Dec. 6, 2001

(30) Foreign Application Priority Data

May 23, 2000 (JP) ........................................ 2000-151751

(51) Int. Cl.$^7$ .............................................. H03H 11/26
(52) U.S. Cl. ...................................... 327/276; 327/565
(58) Field of Search ................................ 327/261–264, 327/269–272, 276–278, 281, 284, 285, 288, 291–293, 295, 565–566; 716/6, 10, 12, 14

(56) References Cited

U.S. PATENT DOCUMENTS

| | | | | |
|---|---|---|---|---|
| 5,982,214 A | * | 11/1999 | Kim | 327/277 |
| 6,081,148 A | * | 6/2000 | Song | 327/292 |
| 6,092,211 A | * | 7/2000 | Hozumi | 713/500 |
| 6,194,937 B1 | * | 2/2001 | Minami | 327/261 |
| 6,204,713 B1 | * | 3/2001 | Adams et al. | 327/293 |
| 6,278,310 B1 | * | 8/2001 | Stave | 327/261 |
| 6,310,506 B1 | * | 10/2001 | Brown | 327/276 |

FOREIGN PATENT DOCUMENTS

| | | |
|---|---|---|
| JP | 8-274260 | 10/1996 |
| JP | 10-11494 | 1/1998 |
| JP | 10-335470 | 12/1998 |

\* cited by examiner

*Primary Examiner*—My-Trang Nu Ton
(74) *Attorney, Agent, or Firm*—Choate, Hall & Stewart

(57) ABSTRACT

In an LSI design method, a delay adjusting block group including a plurality of buffer circuit blocks which have different delay amounts but which are the same in connection to the external shape and the external size of the block, the input terminal position and the output terminal position, the input terminal capacitance and the driving capability of the output part including the load dependency, is previously prepared and registered into a circuit library. One buffer circuit block selected from the delay adjusting block group is inserted into a signal path in question, and the delay amount of the signal path in question is roughly adjusted by an existing delay amount adjusting method without replacing the selected buffer circuit block, and thereafter, the delay amount of the signal path in question is roughly adjusted by replacing the selected buffer circuit block by another buffer circuit block included in the delay adjusting block group but having a different delay amount. Thus, a highly precise delay amount adjustment can be attained easily for a shortened time.

19 Claims, 12 Drawing Sheets

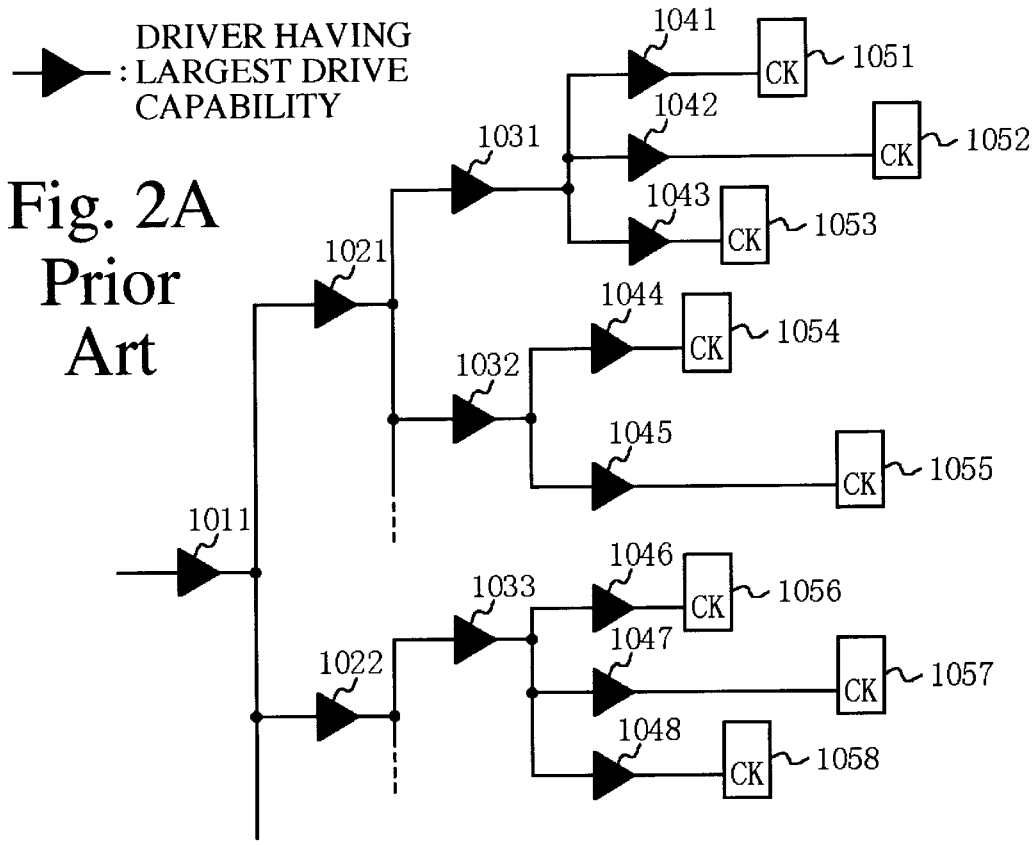
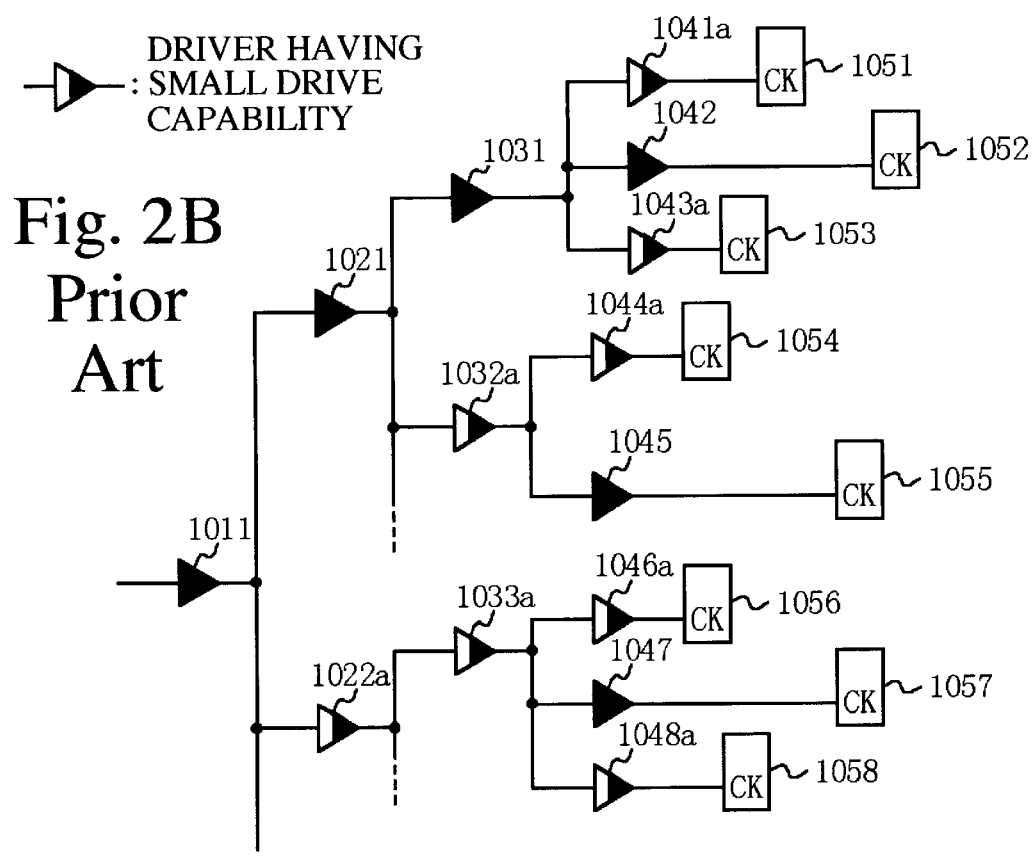

BUFFER CIRCUIT BLOCK AND DESIGN METHOD OF SEMICONDUCTOR INTEGRATED CIRCUIT BY USING THE SAME

BACKGROUND OF THE INVENTION

The present invention relates to a technology for adjusting a delay time of a signal including a clock signal in a semiconductor integrated circuit, and more specifically to the construction of a buffer circuit block and a design method of a semiconductor integrated circuit using the buffer circuit block.

With an increased scale and an increased speed of a semiconductor integrated circuit (called an "LSI" hereinafter), a control of a signal delay time in the inside of the LSI, particularly, a decrease of a clock skew in the LSI including a plurality of circuit blocks operating in synchronism with one clock signal, is strongly demanded more and more. In the prior art, various methods have been proposed for decreasing the clock skew.

Referring to FIGS. 1A and 1B, FIGS. 2A and 2B, and FIG. 3, different prior art methods for decreasing the clock skew are illustrated.

FIG. 1A is a flow chart for illustrating the process disclosed in Japanese Patent Application Pre-examination Publication No. JP-A-10-011494 (called a "first prior art" hereinafter), and FIG. 1B is a circuit diagram showing the example shown in Japanese Patent Application Pre-examination Publication No. JP-A-10-011494. In FIG. 1B, the reference number 922 indicates a clock generating circuit, and the reference numbers 923, 924, 925, 926, 927, 928 and 929 designate a buffer. The reference numbers 930, 931, 932 and 933 show a flipflop. In FIG. 1B, only a clock line is shown, so that a signal line is not shown. In a process shown in the flow chart of FIG. 1A, in the first prior art, buffers on a clock line in a clock tree are replaced with buffers having a different input logic threshold, so that the delay amount of the buffer is changed by utilizing an output waveform dulling of a preceding stage, whereby the clock skew is decreased.

FIGS. 2A and 2B show circuit diagrams illustrating clock trees formed in accordance with the method disclosed in Japanese Patent Application Pre-examination Publication No. JP-A-08-274260 (called a "second prior art" hereinafter). In FIGS. 2A and 2B, the reference numbers 1011 to 1048 designate drivers having a largest drive capability, and the reference numbers 1022a to 1048a indicate drivers having a small drive capability. The reference numbers 1051 to 1058 show a flipflop In addition, only a clock line is shown, so that a signal line is not shown. In the circuitry shown in FIG. 2A composed of largest drive capability drivers located in accordance with a clock tree method, paths excluding a path having a maximum signal delay value from a second stage in the clock tree to a block circuit (flipflop) are modified by replacing one or more largest drive capability drivers with a previously prepared driver having a small driving capability so that the a signal delay time of each path becomes equal to the maximum signal delay value, whereby a clock skew is decreased.

FIG. 3 is a flow chart illustrating a method disclosed in Japanese Patent Application Pre-examination Publication No. JP-A-10-335470 (called a "third prior art" hereinafter). In this third prior art, a placement and routing are carried out for cells in a sequential circuit operating in synchronism with a clock signal, cells in a combinational circuit operating to receive an output of the sequential circuit, and clock buffer cells for supplying the clock signal to the sequential circuit (Step S1). A driving load of the clock buffers in a clock supplying system obtained in the placement and routing is analyzed (Step S2), and a driving capability of the clock drivers are set in accordance with the driving load of the clock buffers (Steps S3 and S4), whereby the skew of the clock signal is highly precisely controlled.

The above mentioned methods of the prior art can be said that a buffer in the clock tree is replaced with another, the input logic threshold or the driving capability of the buffer is changed for adjustment of the delay. Accordingly, if it is sufficient if the clock skew is decreased to a certain limited degree, a deserved advantage can be obtained. However, the replacement of the buffer gives influence the characteristics of the clock tree and a peripheral circuit thereof, or alternatively, an input capacitance of the buffer itself changes. Therefore, unless a delay simulation of an actual routing is executed after the buffer replacement, it is not possible to know to what extent the skew is finally decreased. Accordingly, there is a limit in decreasing the skew.

Furthermore, in a specific signal path having a designated highly precise signal delay amount, when the signal delay of the specific signal path exceeds an admissible limit, it becomes necessary to change the placement and routing in blocks on the path.

BRIEF SUMMARY OF THE INVENTION

Accordingly, it is an object of the present invention to overcome the above mentioned problems of the prior art.

Another object of the present invention is to provide a buffer circuit block capable of easily and highly precisely controlling the delay of a clock signal or a transmitted signal in a clock supplying system or a signal transmission system of the LSI.

Still another object of the present invention is to provide an LSI design method utilizing the buffer circuit block in accordance with the present invention.

The above and other objects of the present invention are achieved in accordance with the present invention by a buffer circuit block for use in a semiconductor integrated circuit, including an input part, an delay adjusting part and an output part, a delay amount of the delay adjusting part being able to be changed within a predetermined range while fixing at least an input terminal capacitance of the input part having an input terminal and a driving capability of the output part including a load dependency.

According to another aspect of the present invention, there is provided a buffer circuit block for use in a semiconductor integrated circuit, including an input part, an delay adjusting part and an output part, each including a plurality of transistors, a delay amount of the delay adjusting part being able to be changed within a predetermined range while fixing at least the position of an input terminal provided in the input part, the position of an output terminal provided in the output part, an external shape and an external size of the buffer circuit block, the shape and the size of the transistors included in the input part, and the shape and the size of the transistors included in the output part.

In the above mentioned buffer circuit block, the delay amount of the delay adjusting part can be changed within the predetermined range while fixing a placement and routing inhibition region where placement and routing of an element that is not included in the buffer circuit block is inhibited within an area of the buffer circuit block.

Furthermore, the plurality of transistors included in the delay adjusting part can include a plurality of transistors having the same conductivity type but having different sizes.

In addition, the input part can include at least one unitary cell constituted of a p-channel field effect transistor and an n-channel field effect transistor, and the delay adjusting part can include a plurality of unitary cells each constituted of a p-channel field effect transistor and an n-channel field effect transistor.

Furthermore, the output part can include a plurality of parallel-connected unitary cells each constituted of a p-channel field effect transistor and an n-channel field effect transistor.

According to still another aspect of the present invention, there is provided a method for designing a semiconductor integrated circuit which includes at least a clock signal driving circuit block, and a plurality of first circuit blocks operating in synchronism with a clock signal supplied from the clock signal driving circuit block, the method including:

a library preparation step to previously prepare at least one delay adjusting block group including a plurality of buffer circuit blocks each of which includes an input part, an delay adjusting part and an output part, and which are the same in connection with an input terminal capacitance of the input part, a driving capability of the output part including a load dependency, and an internal logical operation but have different signal delay values of the delay adjusting part, and then, to register the delay adjusting block group into a circuit library;

a first circuit design step to select, when a circuit design of the semiconductor integrated circuit is carried out by using the circuit library, a first buffer circuit block having a predetermined signal delay value from the circuit library and to insert the selected first buffer circuit block into each clock path of a clock net for interconnecting at least the clock signal driving circuit block and the plurality of first circuit blocks, so as to generate a first circuit connection information of the semiconductor integrated circuit;

a first layout step to execute placement and routing on the basis of the circuit library and the first circuit connection information to generate a first layout information;

an actual routing delay simulation step to execute the actual routing delay simulation of the semiconductor integrated circuit by using a predetermined information including parameters extracted from the first layout information;

a delay information extraction step to extract a signal delay value information of each of various paths of the LSI including the clock net, from the result of simulation obtained in the actual routing delay simulation step;

a first skew confirmation step to compare the signal delay value of each clock path extracted in the delay information extraction step, with a predetermined standardized value and to compare the skew of the clock net with a first predetermined standardized value so as to discriminate whether or not a timing error exists;

when at least the skew of the clock net is larger than the first predetermined standardized value, a first skew adjustment step to modify the placement and routing of the circuit blocks included in the clock net and replace the circuit blocks included in the clock net excluding the first buffer circuit block with another, so as to generate a second circuit connection information and a second layout information;

until at least the skew of the clock net becomes not greater than the first standardized value, the first skew adjustment step, the actual routing delay simulation step, the delay information extraction step and the first skew confirmation step are repeated;

when the skew of the clock net becomes not greater than the first standardized value, a second skew confirmation step to compare the signal delay value of each of the clock paths included in the clock net extracted from the result of the actual routing delay simulation, with the signal delay value of a predetermined first clock path, to extract all second clock paths each having the signal delay value different from the signal delay value of the predetermined first clock path by a value larger than a second standardized value; and a second skew adjustment step to select, for each of all the second clock paths, from the delay adjusting block group, a second buffer circuit block having a delay value sufficient to make the difference between the signal delay value of the second clock path concerned and the signal delay value of the predetermined first clock path, not larger than the second standardized value, to replace the first buffer circuit block in the second clock path concerned with the selected second buffer circuit block so as to generate a third layout information.

According to a further aspect of the present invention, there is provided a method for designing a semiconductor integrated circuit which includes a digital circuit required to have a first signal path having a signal delay time within a predetermined error range from a predetermined desired signal delay time, the method including:

a library preparation step to previously prepare at least one delay adjusting block group including a plurality of buffer circuit blocks each of which includes an input part, an delay adjusting part and an output part, and which are the same in connection with an input terminal capacitance of the input part, a driving capability of the output part including a load dependency, and an internal logical operation but have different signal delay values of the delay adjusting part, and then, to register the delay adjusting block group into a circuit library;

a first circuit design step to select, when a circuit design of the semiconductor integrated circuit is carried out by using the circuit library, a first buffer circuit block having a predetermined signal delay value from the circuit library to insert the selected first buffer circuit block into the first signal path so as to generate a first circuit connection information of the semiconductor integrated circuit;

a first layout step to execute placement and routing on the basis of the circuit library and the first circuit connection information to generate a first layout information;

an actual routing delay simulation step to execute the actual routing delay simulation of the semiconductor integrated circuit by using a predetermined information including parameters extracted from the first layout information;

a delay information extraction step for extracting a signal delay value information of each of various paths of the semiconductor integrated circuit including the first signal path, from the result of simulation obtained in the actual routing delay simulation;

a first delay confirmation step to compare the signal delay value of each path extracted in the delay information extraction step, with a predetermined standardized value, and to compare an absolute value of a difference between the signal delay path of the first signal path and the desired signal delay value, with a predetermined first standardized value so as to discriminate whether or not a timing error exists;

when the absolute value of the difference between the signal delay path of the first signal path and the desired signal delay value is larger than the a predetermined first standardized value, a first delay adjustment step to modify the placement and routing of the circuit blocks included in the first signal path or to replace the circuit blocks excluding the first buffer circuit block by another, so as to generate a second circuit connection information and a second layout information;

until the absolute value of the difference between the signal delay path of the first signal path and the desired signal delay value becomes not larger than the first standardized value, the first delay adjustment step, the actual routing delay simulation step, the delay information extraction step and the first delay confirmation step S61 are repeated;

when the absolute value of the difference between the signal delay path of the first signal path and the desired signal delay value becomes not larger than the first standardized value, a second delay confirmation step to discriminate whether or not the absolute value of the difference between the signal delay path of the first signal path and the desired signal delay value becomes not larger than a second standardized value; and when the absolute value of the difference between the signal delay path of the first signal path and the desired signal delay value becomes not larger than the second standardized value, a second delay adjustment step to select, from the delay adjusting block group including the first buffer circuit block on the first signal path, a second buffer circuit block having a delay value sufficient to make the absolute value of the difference between the signal delay value of the first signal path concerned and the desired signal delay value, not larger than the second standardized value, to replace the first buffer circuit block in the first signal path concerned with the selected second buffer circuit block so as to generate a third layout information.

In the above mentioned method, the plurality of buffer circuit blocks included in the delay adjusting block group can be the same in connection with a routing inhibition region within each buffer circuit block.

Furthermore, the circuit library can include a plurality of delay adjusting block groups, and a maximum signal delay value of the plurality of buffer circuit blocks included in the same delay adjusting block groups is different from one to another of the plurality of delay adjusting block groups.

Assuming that the maximum signal delay value and a minimum signal delay value of the plurality of buffer circuit blocks included in the same delay adjusting block groups are "tpdmax" and "tpdmin", respectively, the circuit library can include at least one delay adjusting block groups having a difference of {tpdmax−tpdmin} larger than the first standardized value.

The above and other objects, features and advantages of the present invention will be apparent from the following description of preferred embodiments of the invention with reference to the accompanying drawings.

BRIEF DESCRIPTION OF THE DRAWINGS

FIGS. 2A and 2B are circuit diagrams respectively illustrating clock trees before and after the delay amount is adjusted in accordance with the delay amount adjusting process of the "second prior art";

DETAILED DESCRIPTION OF THE INVENTION

Now, embodiments of the present invention will be described with reference to the drawings.

First, a delay adjusting block group constituted of a set of buffer circuit blocks, each of which is in accordance with the present invention, will be described. In this specification, the buffer circuit block will be called a "BFB" in some cases.

Figure 1A:
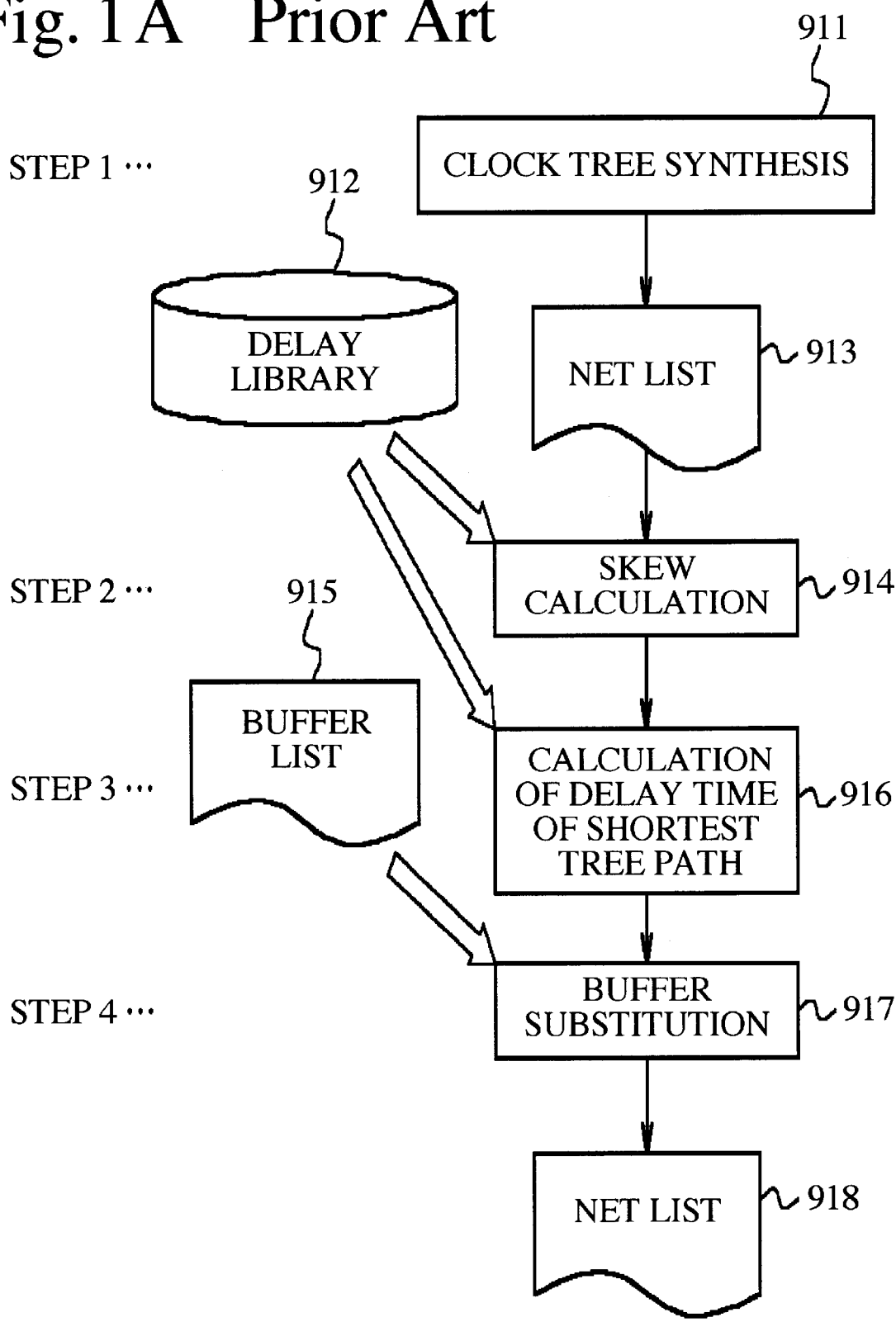
FIG. 1A is a flow chart for illustrating the delay amount adjusting process of the "first prior art"
Figure 1B:
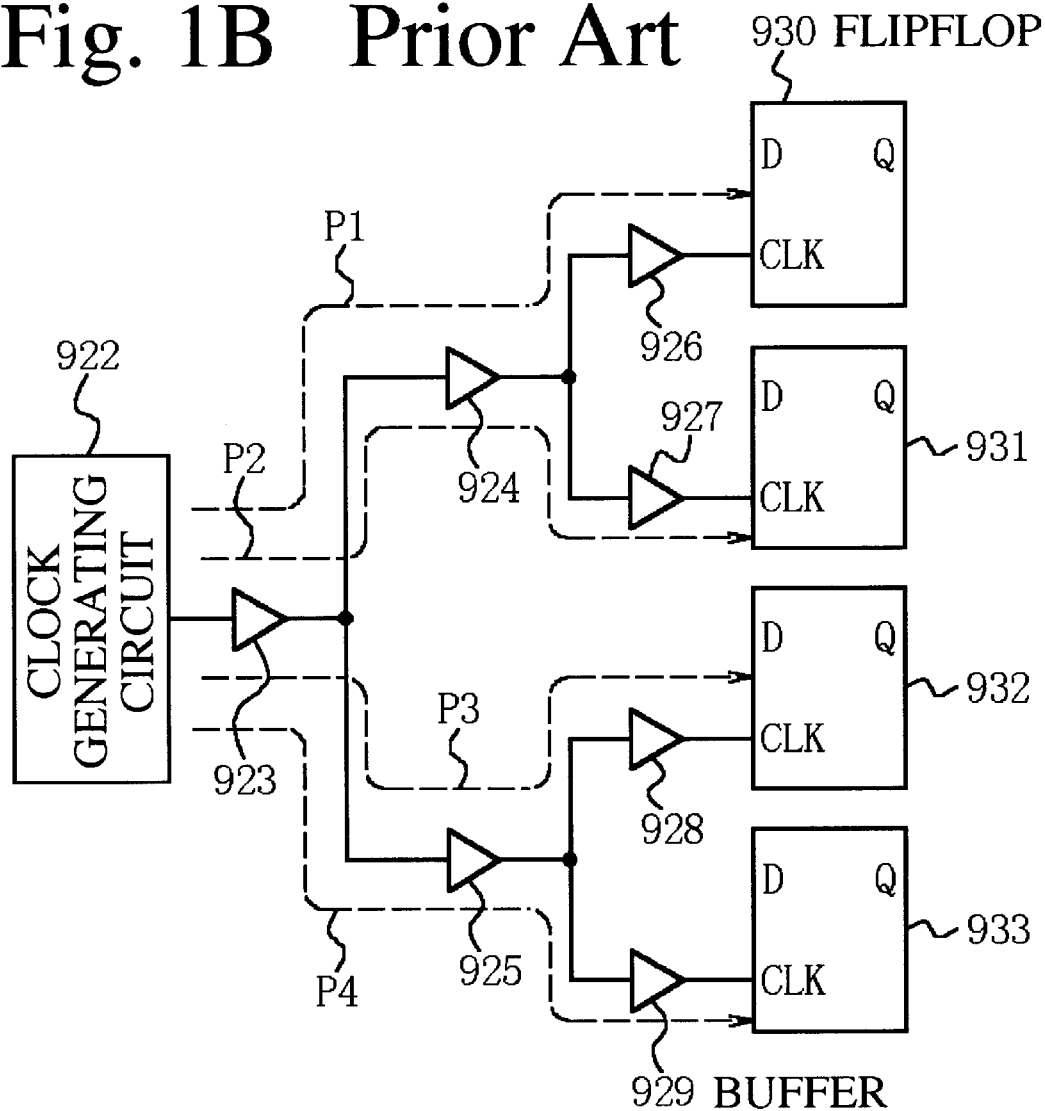
FIG. 1B is a circuit diagram showing a circuit example whose delay amount is adjusted in accordance with the delay amount adjusting process of the "first prior art"
Figure 3:
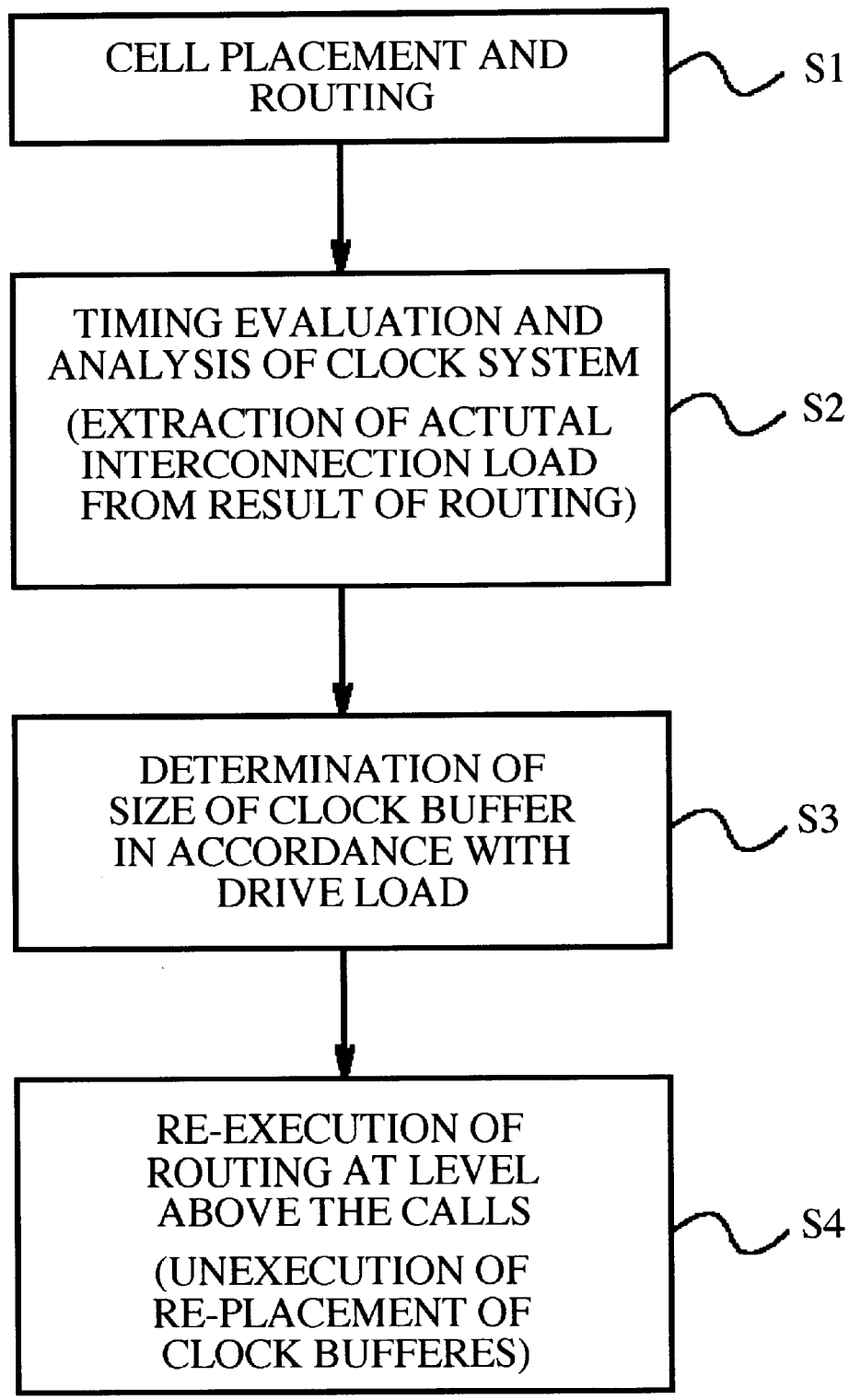
FIG. 3 is a flow chart illustrating the delay amount adjusting process of the "third prior art"
Figure 4:
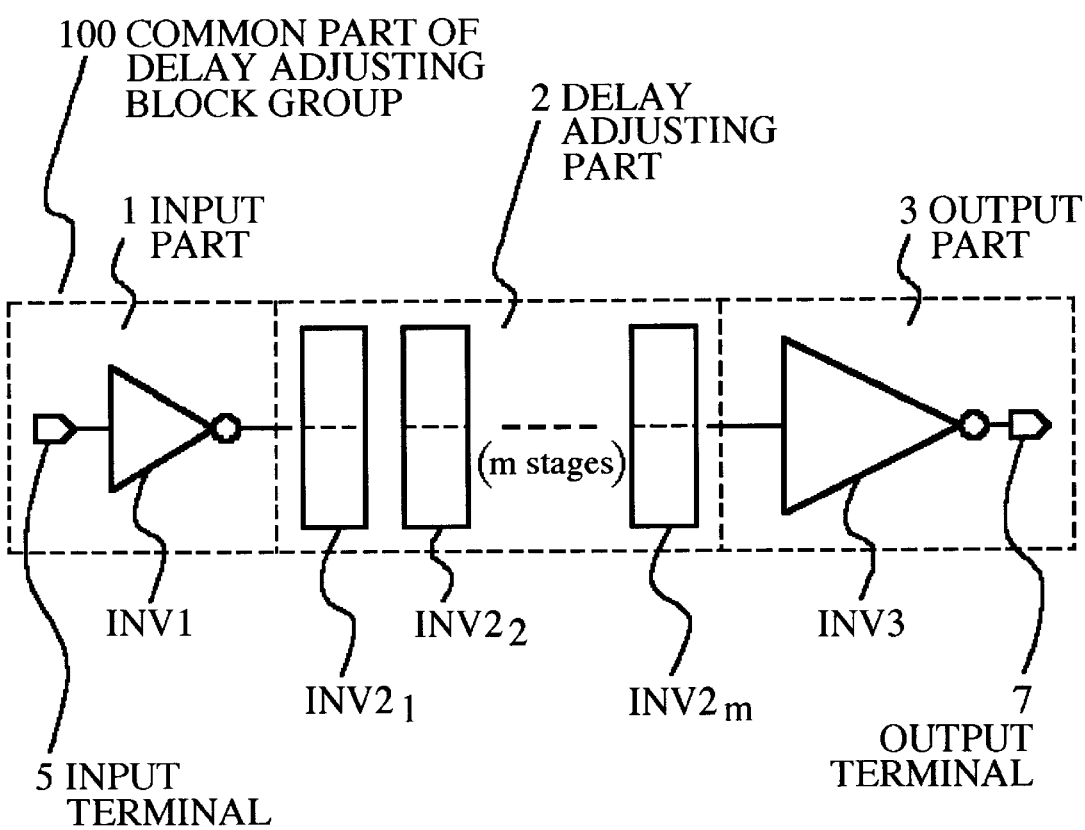
FIG. 4 is a block diagram illustrating a common part of a delay adjusting block group which is a first embodiment of the buffer circuit block in accordance with the present invention.

Referring to FIG. 4, there is shown a block diagram illustrating a common part of buffer circuit blocks which are included in the delay adjusting block group and which are an embodiment of the buffer circuit block in accordance with the present invention. The common part in the delay adjusting block group will be called a "BFBC" in some cases, and is designated with the reference number 100. The BFBC 100 includes an input part 1, a delay adjusting part 2 and an output part 3, which are coupled in cascade as shown in FIG. 4.

For example, the input part 1 is constituted of a first inverter INV1 formed of a PMOS transistor (p-channel field effect transistor) and an NMOS transistor (n-channel field effect transistor) of a predetermined size and having an input connected to an input terminal 5, and the output part 1 is constituted of a third inverter INV3 formed of "k" PMOS transistors connected in parallel to each other and "k" NMOS transistors connected in parallel to each other, where "k" is a natural number larger than "1". An output of the third inverter INV3 is connected to an output terminal 7 The delay adjusting part 2 is constituted of "m" transistors pairs INV2$_1$ to INV2$_m$, which are located in array, and each of which is formed of a PMOS transistor and an NMOS transistor. Here, "m" is a natural number larger than "1".

Accordingly, this BFBC 100 can freely change the delay amount from the input part 1 to the output part 3, and whether a logic value of an output signal is the same as or opposite to that of an input signal, by changing an internal connection of the PMOS transistors and NMOS transistors included in the transistors pairs INV2$_1$, to INV2$_m$ of the delay adjusting part 2, while fixing an external shape and an external size of the BFBC 100, a position of the input terminal 5, a position of the output terminal 7, a layout pattern of the input part 1 and the output part 3.

For example, by utilizing the construction of this BFBC 100, it is possible to construct one delay adjusting block group composed of a plurality of BFBs having an output signal of the same logic value as that of an input signal but having different delay amounts, and another delay adjusting block group composed of a plurality of BFBs having an output signal of the logic value opposite to that of an input signal but having different delay amounts.

Figure 5A:
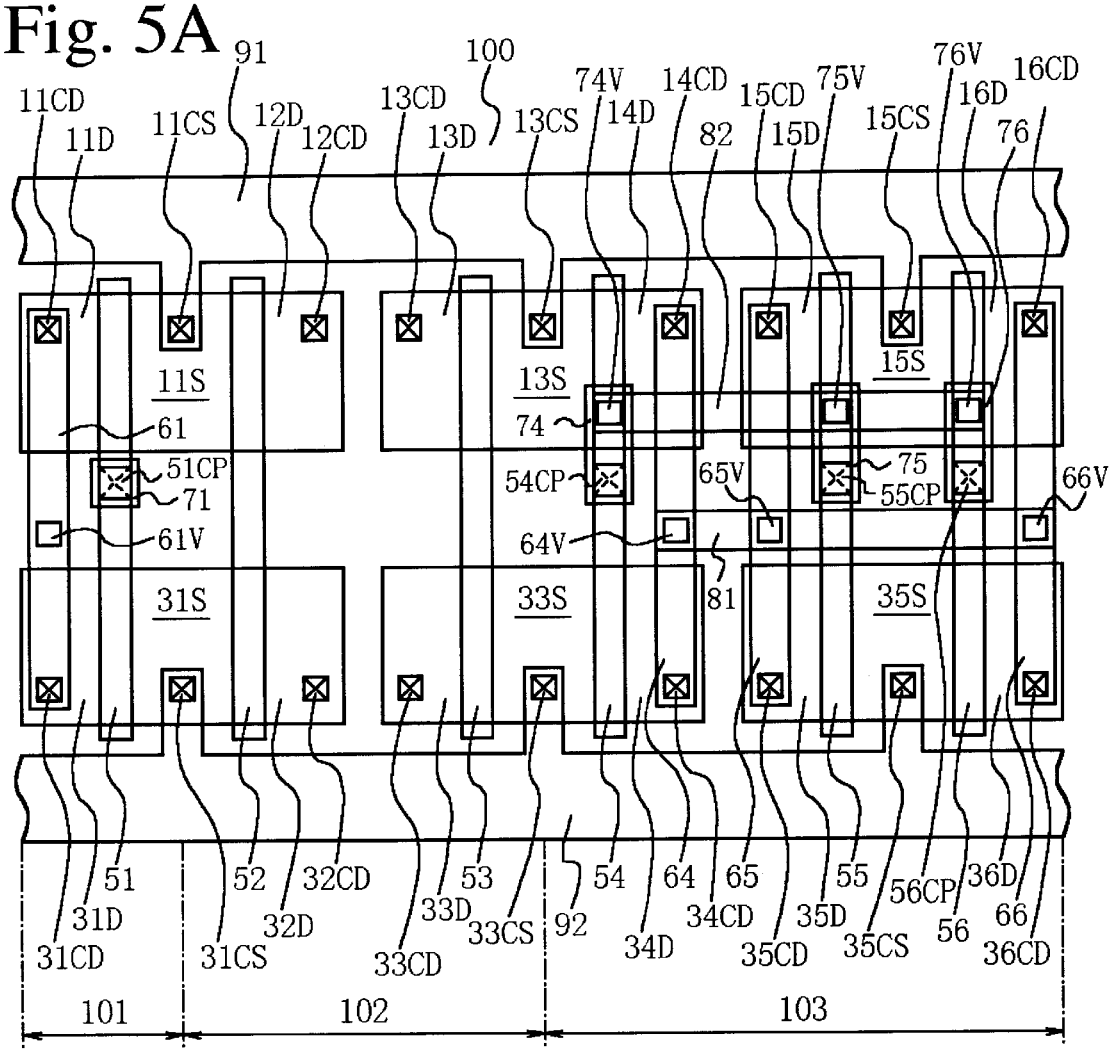
FIG. 5A is a layout pattern diagram of a fixed portion of the first embodiment of the buffer circuit block in accordance with the present invention.
Figure 5B:
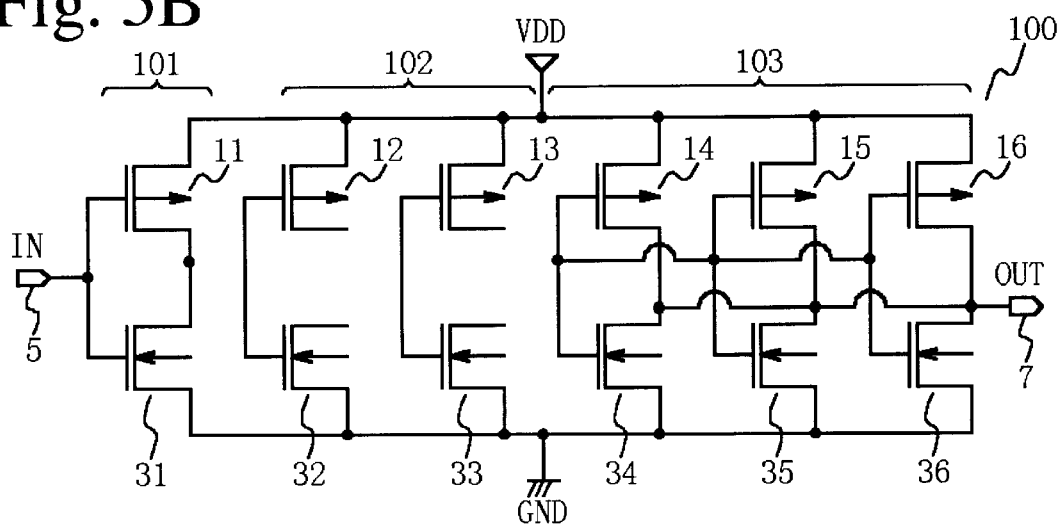
FIG. 5B is an equivalent circuit diagram of the portion shown in FIG. 5A.

Referring to FIG. 5A, there is shown an example of a layout pattern diagram of the BFBC 100 in the case of k=3 and m=2. FIG. 5B is an equivalent circuit diagram of the portion shown in FIG. 5A.

As seen from FIG. 5B, the input part 101 of the BFBC 100, which corresponds to the input part 1 shown in FIG. 4, is constituted of an inverter INV1 formed of a PMOS transistor 11 and an NMOS transistor 31 connected in series between a voltage supply line and a ground line and having their gate connected in common to the input terminal 5. The output part 103 of the BFBC 100, which corresponds to the output part 3 shown in FIG. 4, is constituted of an inverter INV3 formed of three parallel-connected PMOS transistors 14, 15 and 16 having their source connected in common to the voltage supply line and three parallel-connected NMOS transistors 34, 35 and 36 having their source connected in common to the ground line, respective gates of the PMOS transistors 14, 15 and 16 and the NMOS transistors 34, 35 and 36 being connected to each other to constitute an input of the inverter INV3, and respective drains of the PMOS transistors 14, 15 and 16 and the NMOS transistors 34, 35 and 36 being connected in common to the output terminal 7.

The delay adjusting part 102 of the BFBC 100, which corresponds to the delay adjusting part 2 shown in FIG. 4, is constituted of an inverter INV2$_1$ formed of a PMOS transistor 12 and an NMOS transistor 32 connected in series between the voltage supply line and the ground line and having their gate connected to each other, and another inverter INV2$_2$ formed of a PMOS transistor 13 and an NMOS transistor 33 connected in series between the voltage supply line and the ground line and having their gate connected to each other. Therefore, respective sources of the PMOS transistors 12 and 13 are connected to the voltage supply line in parallel to each other, and respective sources of the NMOS transistors 32 and 33 are connected to the ground line in parallel to each other.

More specifically, as shown in FIG. 5A, a common source diffused regions 11S of the PMOS transistors 11 and 12, a common source diffused regions 13S of the PMOS transistors 13 and 14, and a common source diffused regions 15S of the PMOS transistors 15 and 16 are connected through contact holes 11CS, 13CS and 15CS to a power supply (V$_{DD}$) conductor 91, respectively. A common source diffused regions 31S of the NMOS transistors 31 and 32, a common source diffused regions 33S of the NMOS transistors 33 and 34, and a common source diffused regions 35S of the NMOS transistors 35 and 36 are connected through contact holes 31CS, 33CS and 35CS to a ground (GND) conductor 92, respectively.

Respective gates of the PMOS transistor 11 and the NMOS transistor 31 are connected to each other through a polysilicon conductor 51. Respective gates of the PMOS transistor 12 and the NMOS transistor 32 are connected to each other through a polysilicon conductor 52. Respective gates of the PMOS transistor 13 and the NMOS transistor 331 are connected to each other through a polysilicon conductor 53. Respective gates of the PMOS transistor 14 and the NMOS transistor 34 are connected to each other through a polysilicon conductor 54. Respective gates of the PMOS transistor 15 and the NMOS transistor 35 are connected to each other through a polysilicon conductor 55. Respective gates of the PMOS transistor 16 and the NMOS transistor 36 are connected to each other through a polysilicon conductor 56.

Respective drains 11D and 31D of the PMOS transistor 11 and the NMOS transistor 31 are respectively connected through contact holes 11CD and 31CD to a conductor 61 formed of a first level metal interconnection layer so that the respective drains of the PMOS transistor 11 and the NMOS transistor 31 are connected to each other. Respective drains 14D and 34D of the PMOS transistor 14 and the NMOS transistor 34 are respectively connected through contact holes 14CD and 34CD to a conductor 64 formed of the first level metal interconnection layer so that the respective drains of the PMOS transistor 14 and the NMOS transistor 34 are connected to each other. Respective drains 15D and 35D of the PMOS transistor 15 and the NMOS transistor 35 are respectively connected through contact holes 15CD and 35CD to a conductor 65 formed of the first level metal interconnection layer so that the respective drains of the PMOS transistor 15 and the NMOS transistor 35 are connected to each other. Respective drains 16D and 36D of the PMOS transistor 16 and the NMOS transistor 36 are respectively connected through contact holes 16CD and 36CD to a conductor 66 formed of the first level metal interconnection layer so that the respective drains of the PMOS transistor 16 and the NMOS transistor 36 are connected to each other. In addition, at least within the inside of the BFB 110, the power supply (V$_{DD}$) conductor 91 and the ground conductor 92 are formed of the first level metal interconnection layer, respectively.

The input terminal 5 of the BFB 110 is constituted of a conductor 71 formed of the first level metal interconnection layer, which is connected through a contact hole 51CP to the polysilicon conductor 51, which constitutes the common gate of the PMOS transistor 11 and the NMOS transistor 31. The output terminal 7 of the BFB 110 is formed of a conductor 81 which is formed of for example a second level metal interconnection layer and which is connected through via hole 64V, 65V and 66V to the conductors 64, 65 and 66, respectively.

The polysilicon conductor 54 is connected through a contact hole 54CP to a conductor 74 formed of the first level metal interconnection layer. The polysilicon conductor 55 is connected through a contact hole 55CP to a conductor 75 formed of the first level metal interconnection layer. The polysilicon conductor 56 is connected through a contact hole 56CP to a conductor 76 formed of the first level metal interconnection layer. The conductors 74, 75 and 76 are connected through via holes 74V, 75V and 76V to a conductor 82 which is formed of for example the second level metal interconnection layer.

With this arrangement, the delay amount and the logic value of the output signal can be determined by how the conductor 61 (which is the output of the input part 101) and the conductor 82 (which is the input of the output part 103) are connected to the PMOS transistors 12 and 13 and the NMOS transistors 32 and 33 included in the delay adjusting part 102.

Next, explanation will be made on specific examples of the buffer circuit block (BFB) which is included in a delay adjusting block group and which is constituted on the basis of the common part of the BFBC 100 shown in FIGS. 5A and 5B to have such an input-output logic relation that the logic value of the output signal is opposite to that of the input signal.

Figure 6A:
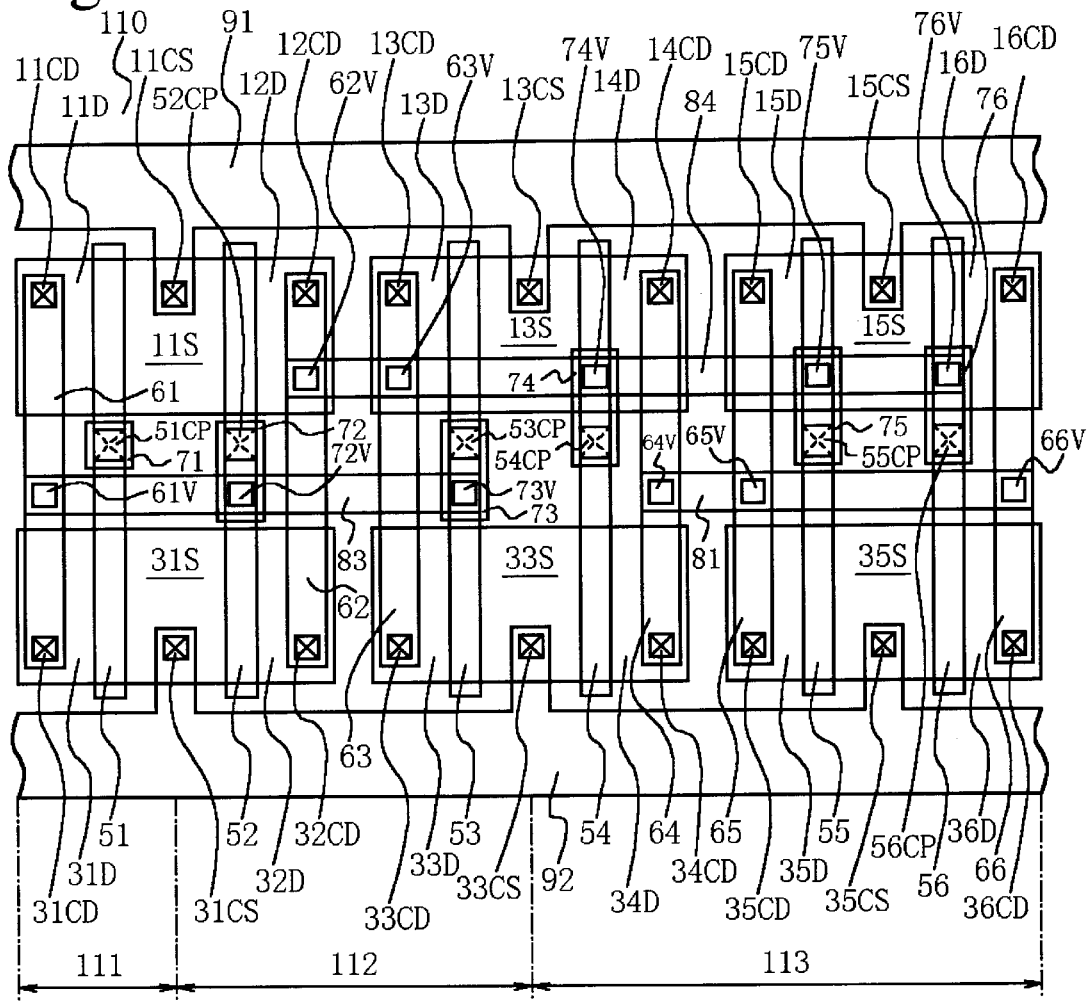
FIG. 6A is a layout pattern diagram of an example of the buffer circuit block in accordance with the first embodiment of the present invention, having additional connections added to the fixed portion shown in FIGS. 5A and 5B.
Figure 6B:
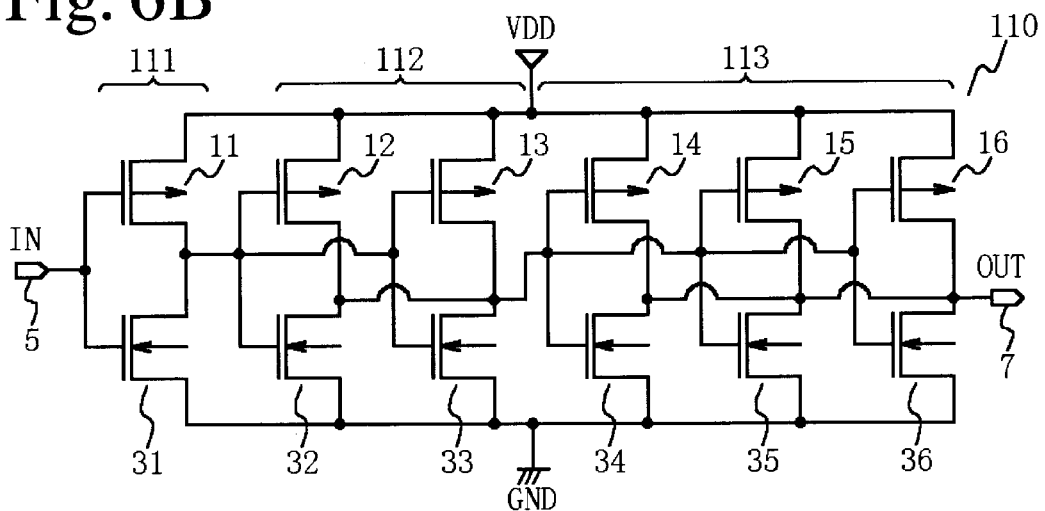
FIG. 6B is an equivalent circuit diagram of the portion shown in FIG. 6A.
Figure 7A:
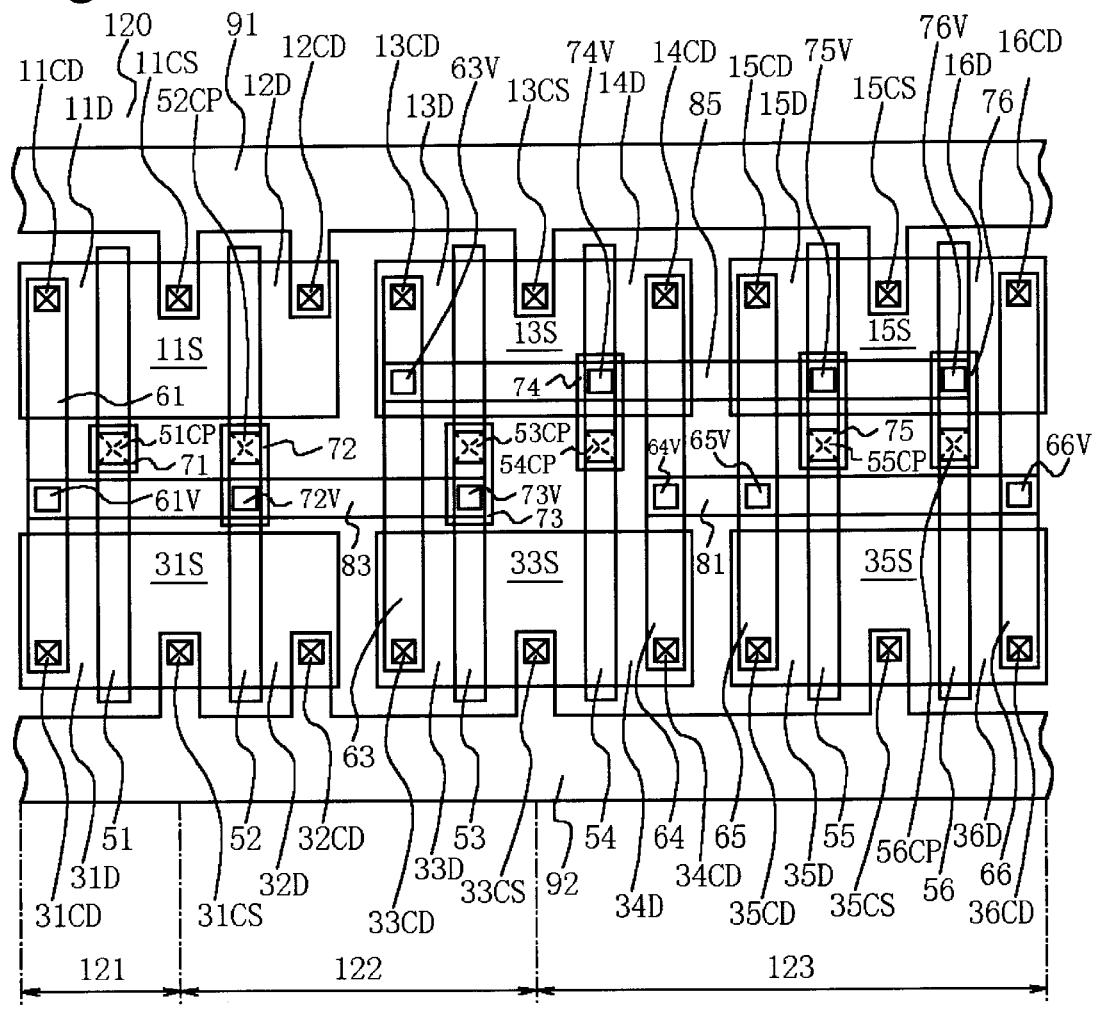
FIG. 7A is a layout pattern diagram of another example of the buffer circuit block in accordance with the first embodiment of the present invention, having additional connections added to the fixed portion shown in FIGS. 5A and 5B.
Figure 7B:
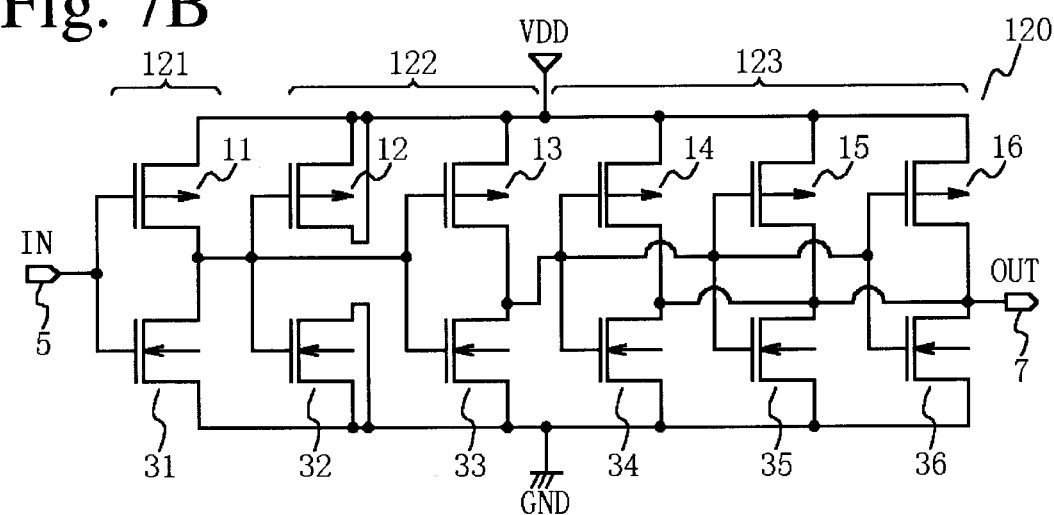
FIG. 7B is an equivalent circuit diagram of the portion shown in FIG. 7A.

FIG. 6A is a layout pattern diagram of a first buffer circuit block (BFB) 110 which is constituted on the basis of the common part of the BFBC 100 shown in FIG. 5A to have such an input-output logic relation that the logic value of the output signal is opposite to that of the input signal. FIG. 6B is an equivalent circuit diagram of the portion shown in FIG. 6A. FIG. 7A is a layout pattern diagram of a second buffer circuit block (BFB) 120 which is constituted on the basis of the common part of the BFBC 100 shown in FIG. 5A to have such an input-output logic relation that the logic value of the output signal is opposite to that of the input signal. FIG. 7B is an equivalent circuit diagram of the portion shown in FIG. 7A. The second buffer circuit block (BFB) 120 shown in FIGS. 7A and 7B has the same input-output logic relation as that in the first buffer circuit block (BFB) 110 shown in FIGS. 6A and 6B, but has a delay amount different from that obtained in the first buffer circuit block (BFB) 110 shown in FIGS. 6A and 6B. In FIGS. 6A and 6B and 7A and 7B, elements corresponding to those shown in FIGS. 5A and 5B are given the same reference numbers.

Referring to FIG. 6B, the input part 111 of the BFB 110, which corresponds to the input part 1 shown in FIG. 4, is constituted of the inverter INV1 formed of the PMOS transistor 11 and the NMOS transistor 31 connected in series between the voltage supply line and a ground line and having their gate connected in common to the input terminal 5, similar to the input part 101 of the BFBC 100. The output part 113 of the BFB 110, which corresponds to the output part 3 shown in FIG. 4, is constituted of the inverter INV3, similar to the output part 103 of the BFBC 100. Namely, the output part 113 is formed of three parallel-connected PMOS transistors 14, 15 and 16 having their source connected in common to the voltage supply line and three parallel-connected NMOS transistors 34, 35 and 36 having their source connected in common to the ground line, respective gates of the PMOS transistors 14, 15 and 16 and the NMOS transistors 34, 35 and 36 being connected to each other to constitute the input of the inverter INV3, and respective drains of the PMOS transistors 14, 15 and 16 and the NMOS transistors 34, 35 and 36 being connected in common to the output terminal 7.

On the other hand, the delay adjusting part 112 of the BFB 110, which corresponds to the delay adjusting part 2 shown in FIG. 4, includes the inverter $INV2_1$ formed of the PMOS transistor 12 and the NMOS transistor 32, and the inverter $INV2_2$ formed of the PMOS transistor 13 and the NMOS transistor 33, similarly to the delay adjusting part 102 of the BFB 100. However, differently from the delay adjusting part 102 of the BFB 100, the inverter $INV2_1$ and the inverter $INV2_2$ are located in parallel, so that an input of each of the inverter $INV2_1$ and the inverter $INV2_2$ is connected to an output of the input part 111 of the BFB 110, and an output of each of the inverter $INV2_1$ and the inverter $INV2_2$ is connected to an input of the output part 113 of the BFB 110.

More specifically, as shown in FIG. 6A, the common source diffused regions 11S of the PMOS transistors 11 and 12, the common source diffused regions 13S of the PMOS transistors 13 and 14, and the common source diffused regions 15S of the PMOS transistors 15 and 16 are connected through contact holes 11CS, 13CS and 15CS to the power supply ($V_{DD}$) conductor 91, respectively. The common source diffused regions 31S of the NMOS transistors 31 and 32, the common source diffused regions 33S of the NMOS transistors 33 and 34, and the common source diffused regions 35S of the NMOS transistors 35 and 36 are connected through contact holes 31CS, 33CS and 35CS to the ground (GND) conductor 92, respectively.

Respective gates of the PMOS transistor 11 and the NMOS transistor 31 are connected to each other through the polysilicon conductor 51. Respective gates of the PMOS transistor 12 and the NMOS transistor 32 are connected to each other through the polysilicon conductor 52. Respective gates of the PMOS transistor 13 and the NMOS transistor 331 are connected to each other through the polysilicon conductor 53. Respective gates of the PMOS transistor 14 and the NMOS transistor 34 are connected to each other through the polysilicon conductor 54. Respective gates of the PMOS transistor 15 and the NMOS transistor 35 are connected to each other through the polysilicon conductor 55. Respective gates of the PMOS transistor 16 and the NMOS transistor 36 are connected to each other through the polysilicon conductor 56.

Respective drains 11D and 31D of the PMOS transistor 11 and the NMOS transistor 31 are respectively connected through contact holes 11CD and 31CD to the conductor 61 formed of the first level metal interconnection layer so that the respective drains of the PMOS transistor 11 and the NMOS transistor 31 are connected to each other. Respective drains 12D and 32D of the PMOS transistor 12 and the NMOS transistor 32 are respectively connected through contact holes 12CD and 32CD to the conductor 62 formed of the first level metal interconnection layer so that the respective drains of the PMOS transistor 12 and the NMOS transistor 32 are connected to each other. Respective drains 13D and 33D of the PMOS transistor 13 and the NMOS transistor 33 are respectively connected through contact holes 13CD and 33CD to the conductor 63 formed of the first level metal interconnection layer so that the respective drains of the PMOS transistor 13 and the NMOS transistor 33 are connected to each other. Respective drains 14D and 34D of the PMOS transistor 14 and the NMOS transistor 34 are respectively connected through contact holes 14CD and 34CD to the conductor 64 formed of the first level metal interconnection layer so that the respective drains of the PMOS transistor 14 and the NMOS transistor 34 are connected to each other. Respective drains 15D and 35D of the PMOS transistor 15 and the NMOS transistor 35 are respectively connected through contact holes 15CD and 35CD to the conductor 65 formed of the first level metal interconnection layer so that the respective drains of the PMOS transistor 15 and the NMOS transistor 35 are connected to each other. Respective drains 16D and 36D of the PMOS transistor 16 and the NMOS transistor 36 are respectively connected through contact holes 16CD and 36CD to the conductor 66 formed of the first level metal interconnection layer so that the respective drains of the PMOS transistor 16 and the NMOS transistor 36 are connected to each other. In addition, at least within the inside of the BFB 110, the power supply ($V_{DD}$) conductor 91 and the ground conductor 92 are formed of the first level metal interconnection layer, respectively.

The input terminal 5 of the BFB 110 is constituted of the conductor 71 formed of the first level metal interconnection layer, which is connected through the contact hole 51CP to the polysilicon conductor 51, which constitutes the common gate of the PMOS transistor 11 and the NMOS transistor 31. The output terminal 7 of the BFB 110 is formed of the conductor 81 which is formed of for example the second level metal interconnection layer and which is connected through via hole 64V, 65V and 66V to the conductors 64, 65 and 66, respectively.

The conductor 61, which constitutes the output of the input part 111, is connected through a via hole 61V to a conductor 83 formed of the second level metal interconnection layer. The conductor 83 is connected through via holes 72V and 73V to conductors 72 and 73 formed of the first level metal interconnection layer, respectively. The conductors 72 and 73 are connected to the polysilicon conductors 52 and 53 through contact holes 52CP and 53CP, respectively. Namely, all the gate electrodes of the PMOS transistors 12 and 13 and the NMOS transistors 32 and 33 included in the delay adjusting part 112, are connected to the conductor 61, which constitutes the output of the input part 111.

Furthermore, the conductor 62 connected to the drain diffused regions 12D and 32D of the PMOS transistor 12 and the NMOS transistor 32, and the conductor 63 connected to the drain diffused regions 12D and 32D of the PMOS transistor 12 and the NMOS transistor 32, are connected through via holes 62V and 63V to a conductor 84 which is formed of a second level metal interconnection layer and which constitutes an output of the delay adjusting part 112. The conductor 84 is connected through via holes 74V, 75V and 76V to the conductors 74, 75 and 76, respectively, which are formed of the first level metal interconnection layer and are connected through the contact holes 54CP, 55CP and 56CP to the polysilicon conductors 54, 55 and 56 in the output part 113, respectively. Namely, the gate electrodes of all the PMOS transistors 14, 15 and 16 and the NMOS transistors 34, 35 and 36 included in the output part 113 are connected to the conductor 84 which is the output of the delay adjusting part 112.

Next, the buffer circuit block (BFB) 120 will be described with reference to the FIGS. 7A and 7B, in which elements corresponding to those shown in FIGS. 5A, 5B, 6A and 6B are given the same reference numbers, and explanation will be omitted for simplification of the description.

An input part 121 and an output part 123 of the BFB 120 are completely the same as the input part 111 and an output part 113 of the BFB 110, respectively, and therefore explanation of the input part 121 and the output part 123 will be omitted.

A delay adjusting part 122 of the BFB 120 is different from the delay adjusting part 112 of the BFB 110 only in that the drain diffused region 12D of the PMOS transistor 12 is connected through the contact hole 12CD to the power supply line 91 and the drain diffused region 32D of the NMOS transistor 32 is connected through the contact hole 32CD to the ground line 92 and on the other hand the conductor 62 provided in the BFB 110 is omitted, and the conductor 84 provided in the BFB 110 is replaced with a conductor 85 which is connected to the conductor 63 through the via hole 63V and is connected to the conductors 74, 75 and 76 through the via holes 74V, 75V and 76V, respectively, in order to connect an output of the delay adjusting part 122 of the BFB 120 to the output part 123 of the BFB 120.

Namely, the delay adjusting part 112 of the BFB 110 shown in FIGS. 6A and 6B is so constructed that the PMOS transistors 12 and 13 and the NMOS transistors 32 and 33 constitute the parallel-connected inverters, and on the other hand, the delay adjusting part 122 of the BFB 120 is so constructed that only the PMOS transistor 13 and the NMOS transistor 33 constitute the inverter, so that the delay adjusting part 122 of the BFB 120 has a drive capacity which is a half of the drive capacity of the delay adjusting part 112 of the BFB 110. Accordingly, the delay adjusting part 122 of the BFB 120 has a delay amount which is correspondingly larger than that in the drive capacity of the delay adjusting part 112 of the BFB 110. In addition, the BFB 110 and the BFB 120 have the same external shape and the same size of the block, the same position of the input terminal, the same position of the output terminal, the same capacitance of the input terminal, and the same driving capability. Therefore, if a placement and routing inhibition region is generated on the basis of the "union of sets" of the element placement and routing pattern of the BFB 110 and the element placement and routing pattern of the BFB 120, it is possible to replace one of the BFB 110 and the BFB 120 by the other with giving no influence to a peripheral region, after the placement and routing of an LSI using either one of the BFB 110 and the BFB 120 are completed. Furthermore, it is possible to guarantee without re-simulation that the delay time of a path inserted with this BFB changes by a difference between the delay time of the BFB to be removed and the delay time of the BFB to be inserted.

The above mentioned embodiments are such that the input part, the delay adjusting part and the output part are constituted of transistors of the same size and the same shape. However, in the scope of the principle of the present invention that all BFBs included in the same delay adjusting block group are completely the same in connection with the external shape and the external size of the block, the position of the input terminal, the position of the output terminal, the capacitance of the input terminal, and the driving capability of the output part including the load dependency, each of the input part, the delay adjusting part and the output part can be constituted of transistors of the size and the shape different from those of transistors included in another part. In other words, this means that it is sufficient if all BFBs included in at least the same delay adjusting block group are the same in connection with the external shape and the external size of the block, the position of the input terminal, and the position of the output terminal, and if the transistors of the input part and the output part included in each BFB are the same in connection with the shape and the size of the transistor and the placement of the transistor within the block. In the delay adjusting part, on the other hand, transistors having a different size, namely, a different driving capability, can be suitably incorporated so that the delay amount adjustable in one delay adjusting block group can be enlarged while minimizing the increase in size of the block.

Now, the LSI design method in accordance with the present invention will be described with reference to the drawings.

Figure 8:
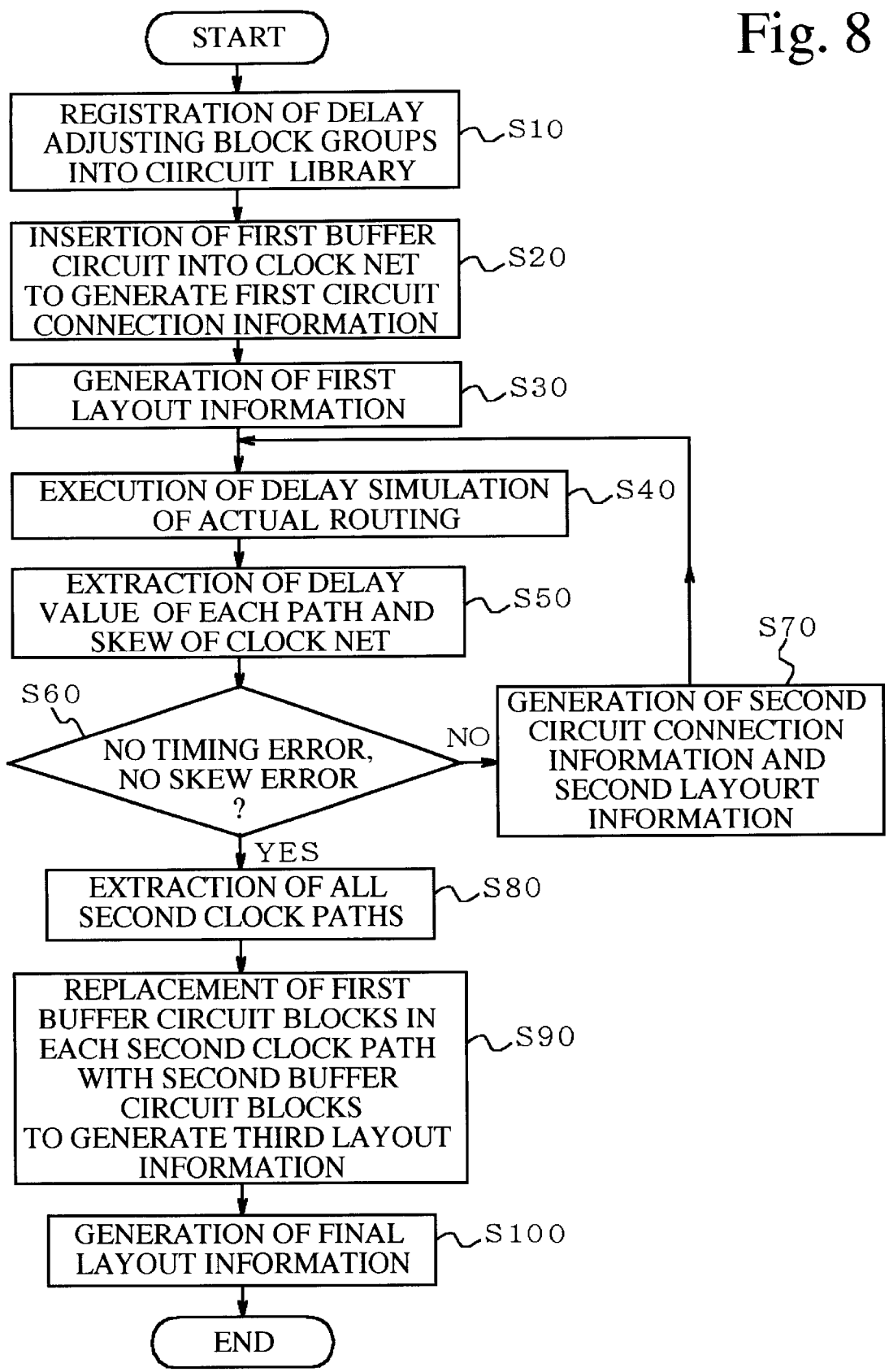
FIG. 8 is a flow chart illustrating a first embodiment of the LSI design method in accordance with the present invention.

Referring to FIG. 8, there is shown a flow chart illustrating a first embodiment of the LSI design method in accordance with the present invention.

The LSI designed in accordance with the LSI design method of the present invention includes at least a clock signal driving circuit block and a plurality of first circuit blocks operating in synchronism with a clock signal supplied from the clock signal driving circuit block.

Referring to FIG. 8, the first embodiment of the LSI design method in accordance with the present invention includes:

a library preparation step S10 to previously prepare and register one or more necessary delay adjusting block groups into a circuit library;

a first circuit design step S20 to select a first BFB having a predetermined signal delay value from the circuit library to insert the selected first BFB into each clock path of a clock net so as to generate a first circuit connection information of the LSI;

a first layout step S30 to execute placement and routing on the basis of the circuit library and the first circuit connection information to generate a first layout information;

an actual routing delay simulation step S40 to execute the actual routing delay simulation of the LSI by using a predetermined information including parameters extracted from the first layout information;

a delay information extraction step S50 for extracting a signal delay value information of each of various paths of the LSI including the clock net, from the result of simulation obtained in the actual routing delay simulation step S40;

a first skew confirmation step S60 to compare the extracted signal delay value of each path with a predetermined standardized value and to compare the skew of the clock net with a predetermined standardized value to discriminate whether or not a timing error exists;

when a timing error is detected, a first skew adjustment step S70 to modify the placement and routing so as to generate a second circuit connection information and a second layout information;

until at least the skew of the clock net becomes not greater than a first standardized value, the first skew adjustment step S70, the actual routing delay simulation step S40, the delay information extraction step S50 and the first skew confirmation step S60 are repeated;

when all the timing errors are canceled, a second skew confirmation step S80 to compare the signal delay value of each of clock paths included in the clock net extracted from the result of the actual routing delay simulation, with the signal delay value of a predetermined first clock path, to extract all second clock paths each having the signal delay value different from the signal delay value of the predetermined first clock path by a value larger than a second standardized value;

a second skew adjustment step S90 to select, for each of all the second clock paths, a second BFB having a delay value sufficient to make the difference between the signal delay value of the second clock path concerned and the signal delay value of the predetermined first clock path, not larger than the second standardized value, to replace the first BFB in the second clock path concerned with the selected second BFB so as to generate a third layout information; and a final layout information generation step S100.

Next, a specific procedure of this design method will be described with reference to FIGS. 9A, 9B and 9C, which are block diagrams of diagrammatic clock nets, for illustrating the process of the first embodiment of the LSI design method in accordance with the present invention.

Here, consider that a maximum standardized value of the clock skew required for an LSI to be designed is the second standardized value "tsk", and the first standardized value is "tske0" (>tsk). This first standardized value "tske0" is preferred to be set to a skew value which can be relatively easily attained by utilizing existing clock skew decreasing methods including the methods of the first, second and third prior arts.

First, in the library preparation step S10, one or more delay adjusting block groups each including a plurality of BFBs having different signal delay values, required for design of a desired LSI, are designed, and registered in a predetermined circuit library which already includes the other necessary information. At this time, each of the BFBs included in the same delay adjusting block group is the BFB constituted of the input part, the delay adjusting part and the output part, and all the BFBs included in the same delay adjusting block group are the same in connection with the shape, the size and the placement and routing inhibition region of the block, the shape, the size and the placement of the transistors included in the input part, the input terminal position, the input terminal capacitance, the shape, the size and the placement of the transistors included in the output part, the output terminal position, the driving capability including the load dependency, and the logic operation of the delay adjusting part. However, all the BFBs included in the same delay adjusting block group are different only the signal delay value of the delay adjusting part. Furthermore, assuming that within the same delay adjusting block group, the signal delay value of the BFB having a minimum signal delay value is "tpdgmin" and the signal delay value of the BFB having a maximum signal delay value is "tpdgnmx", it is preferred that the BFBs included in the same delay adjusting block group are prepared to fulfill such a relation that a difference between the maximum signal delay value and the minimum signal delay value is not smaller than the first standardized value "tske0" (tske0·tcrmax1 (=tpdgmax−tpdgmin)). In addition, it is also preferred that, within the same delay adjusting block group, when one BFB is arbitrarily selected, there necessarily exists another BFB having such a relation that a difference between the signal delay value of the selected BFB and the signal delay value of the second BFB is not greater than the second standardized value "tsk". Incidentally, the placement and routing inhibition region can be set on the basis of the "union of sets" of the element placement and routing pattern of all the BFBs included in the same delay adjusting block.

Next, in the first circuit design step S20, a circuit design of the LSI realizing a desired function is carried out by using the circuit library thus prepared. At this time, a first BFB having a predetermined signal delay value is selected from one delay adjusting block group (which is identified by giving the reference number "200" here) including a maximum delay adjusting amount "tcrmax1" larger than the first standard value "tsk0", and the selected first BFB is inserted into a clock path which constitutes a clock net at least interconnecting a clock signal driving circuit block and a plurality of first circuit blocks, so that a first circuit connection information of the LSI is generated.

Figure 9:
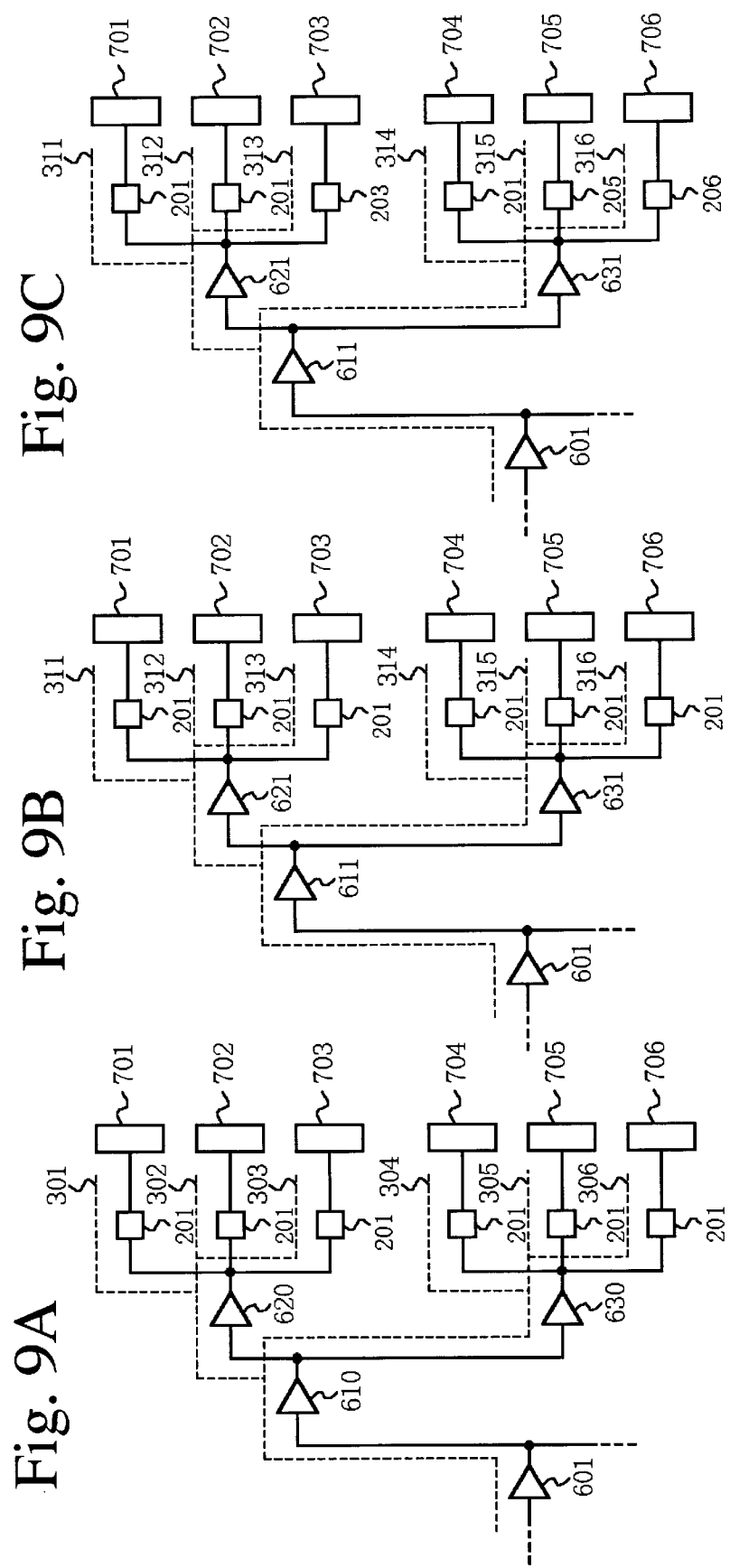
FIGS. 9A, 9B and 9C are block diagrams of diagrammatic clock nets, for illustrating the process of the first embodiment of the LSI design method in accordance with the present invention.

Here, it is assumed that, as the first BFB, a BFB 201 having a minimum signal delay value within the delay adjusting block group 200 is selected, as shown in FIG. 9A, and the delay adjusting block group 200 includes a number of BFBs 201, . . . , 203, . . . , 205, 208, . . . .

FIG. 9A illustrates one example of the clock net included in the first circuit connection information The clock net shown in FIG. 9A is identified by giving the reference number "300" here. This clock net 300 includes a number of clock paths 301 to 306 for interconnecting one clock signal drive circuit block 610 to a plurality of first circuit blocks 701 to 706. By inserting the first BFB 201 into each of the clock paths 301 to 306, the first circuit connection information is generated. Here, the first BFB 201 is inserted at a final stage of each clock path 301 to 306, namely, just before each first circuit block 701 to 706 Here, not explaining in detail, it is assumed that a logic verification and a timing verification have already been completed at a conventional circuit connection information level.

In the first layout step S30, the placement and routing are carried out on the basis of the circuit library and the first circuit connection information to generate a first layout information.

In the actual routing delay simulation step S40, an actual routing delay simulation of the LSI concerned is carried out on the basis of parameters extracted from the circuit library, the first circuit connection information and the first layout information, and then, in the delay information extraction step S50, the signal delay value information of each path included in the clock net 300 is extracted from the result of the simulation.

In the first skew confirmation step S60, the extracted signal delay value of each path is compared with the predetermined standardized value, and the skew value "tskn0" of the clock net 300 is compared with the first standardized value "tske0", to discriminate whether or not there exists a timing error larger than the predetermined standardized value and whether or not there exists a skew error larger than the first standardized value "tske0".

In this first skew confirmation step S60, when the timing error or the skew error is detected, the process goes into the first skew adjustment step S70, in which in the path in which the error is detected, the replacement of the circuit block or the modification of the placement and routing is carried out to generate the second circuit connection information and the second layout information. Here, however, the replacement of the first BFB 201 inserted in the clock net 300 is not carried out, but the modification is limited only to the replacement of circuit blocks 610, 620 and 630 and/or the placement and routing of the clock paths 301 to 306.

Thereafter, on the basis of the second circuit connection information and the second layout information thus generated, the actual routing delay simulation step S40, the delay information extraction step S50, and the first skew confirmation step S60 are repeated. In any case, until all the timing errors and the skew errors are canceled, a process composed of the first skew adjustment step S70, the actual routing delay simulation step S40, the delay information extraction step S50, and the first skew confirmation step S60 is repeated.

FIG. 9B illustrates the construction of the clock net 300 when it is confirmed in the first skew confirmation step S60 that all the timing errors and the skew errors are canceled. As seen from comparison between FIGS. 9A and 9B, the circuit blocks 610, 620, 630 are changed to the circuit blocks 611, 621 and 631, respectively, so that the clock paths 301 to 306 are modified to the clock paths 311 to 316, respectively. Accordingly, until this point in time, the adjustment is carried out with no replacement of the first BFB 201.

In the second skew confirmation step S80, on the basis of the signal delay value information of each path 311 to 316 extracted from the result of the actual routing delay simulation, all second clock paths having the signal delay value different from the signal delay value of a predetermined first clock path by a value larger than the second standardized value "tsk", are extracted. Here, assuming that, amount the clock paths 311 to 321, the clock path 311 has a maximum signal delay, this the clock path 311 is considered to be the predetermined first clock path. In addition, it is assumed that the clock paths 313, 315 and 316 are picked up as the second clock paths mentioned above.

In the second skew adjustment step S90, a difference between the signal delay value of the clock path 311 (which is the first clock path) and for example the clock path 313 picked up as the second clock path, is calculated. Then, from the BFBs included in the delay adjusting block group 200, there is selected, as a replacement BFB, a BFB (identified by giving the reference number "203" here) having the signal delay value which is not greater than but nearest to the value obtained by adding the calculated delay value difference to the signal delay value of the BFB 201. A similar processing is carried out in connection with the clock paths 315 and 316 picked up as the second clock paths mentioned above, for example, a BFB 205 and a BFB 206 are selected. The BFBs 201 inserted in the clock paths 313, 315 and 316 are replaced with the BFBs 203, 205 and 206, respectively, as shown in FIG. 9C, to modify the second layout information and to generate the third layout information. FIG. 9C illustrates the construction of the clock net 300 when the second skew confirmation step S90 is completed.

Here, if the delay adjusting block group is prepared to fulfill a condition that the maximum delay adjusting amount "tcrmax1" is larger than the first standard value "tsk0" and when one BFB is arbitrarily selected, there necessarily exists another BFB having such a relation that a difference between the signal delay value of the selected BFB and the signal delay value of the second BFB is not greater than the second standardized value "tsk", this process can make the skew value of the clock net 300 not greater than the second standardized value "tsk".

Finally, in the final layout information generation step S100, for the third layout information thus generated, a predetermined design rule checking and others are carried out to generate a final layout information which is used for preparing reticles for the LSI fabrication or for an electron beam direct exposure.

Incidentally, in the second skew confirmation step S80, if the second clock path is not extracted, the newest second layout information when the second skew confirmation step S80 is carried out is used without modification as the third layout information.

Figure 10:
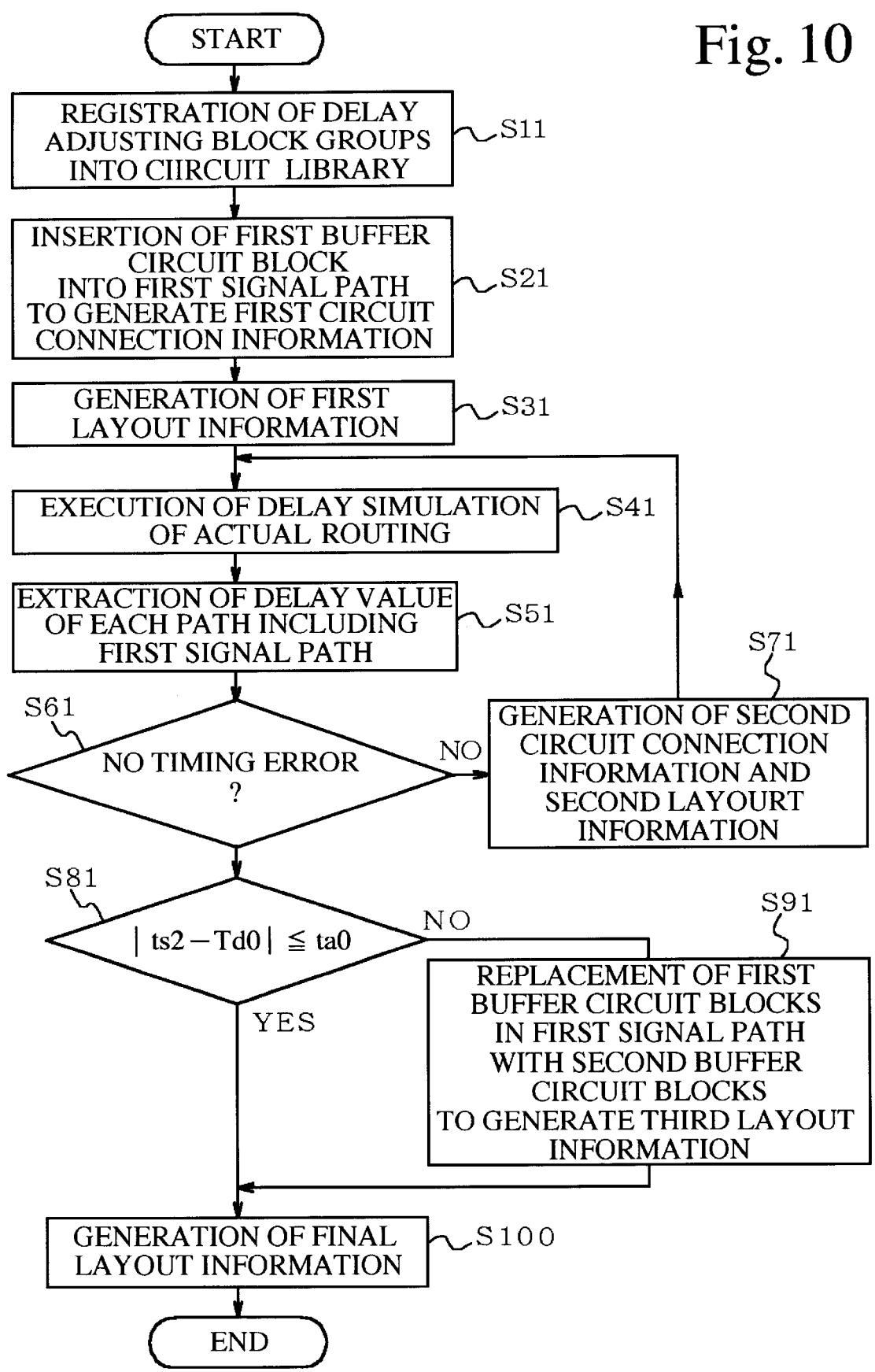
FIG. 10 is a flow chart illustrating a second embodiment of the LSI design method in accordance with the present invention.

Referring to FIG. 10, there is shown a flow chart illustrating a second embodiment of the LSI design method in accordance with the present invention. It is assumed that the LSI designed in accordance with the LSI design method of this embodiment includes at least a digital circuit required to have a designated signal path having the signal delay time within a predetermined error range from a predetermined desired signal delay time.

Referring to FIG. 10, the second embodiment of the LSI design method in accordance with the present invention includes:

a library preparation step S11 to previously prepare and register one or more necessary delay adjusting block groups into a circuit library;

a first circuit design step S21 to select a first BFB having a predetermined signal delay value from the circuit library to insert the selected first BFB into a predetermined first signal path so as to generate a first circuit connection information of the LSI;

a first layout step S31 to execute placement and routing on the basis of the circuit library and the first circuit connection information to generate a first layout information;

an actual routing delay simulation step S41 to execute the actual routing delay simulation of the LSI by using a predetermined information including parameters extracted from the first layout information;

a delay information extraction step S51 for extracting a signal delay value information of each of various paths of the LSI including the first signal path, from the result of simulation obtained in the actual routing delay simulation step S41;

a first delay confirmation step S61 to compare the extracted signal delay value of each path with a predetermined standardized value and to compare an absolute value of a difference between the signal delay path of the first signal path and a desired signal delay value, with a predetermined first standardized value so as to discriminate whether or not a timing error exists;

when a timing error is detected, a first delay adjustment step S71 to modify the placement and routing so as to generate a second circuit connection information and a second layout information;

until at least the absolute value of the difference between the signal delay path of the first signal path and the desired signal delay value becomes not larger than the first standardized value, the first delay adjustment step S71, the actual routing delay simulation step S41, the delay information extraction step S51 and the first delay confirmation step S61 are repeated;

when all the timing errors are canceled, a second delay confirmation step S81 to compare the difference between the signal delay value of the first signal path extracted from the result of the actual routing delay simulation and the desired signal delay value, with a second standardized value, to discriminate whether a timing error exists;

when it is detected in the second delay confirmation step S81 that the absolute value of the difference between the signal delay value of the first signal path and the desired signal delay value is larger than the second standardized value, a second delay adjustment step S91 to select, from a delay adjusting block group including the first BFB on the first signal path, a second BFB having a delay value sufficient to make the absolute value of the difference between the signal delay value of the first signal path concerned and the desired signal delay value, not larger than the second standardized value, to replace the first BFB in the first signal path concerned with the selected second BFB so as to generate a third layout information; and a final layout information generation step S100.

Figure 11A:
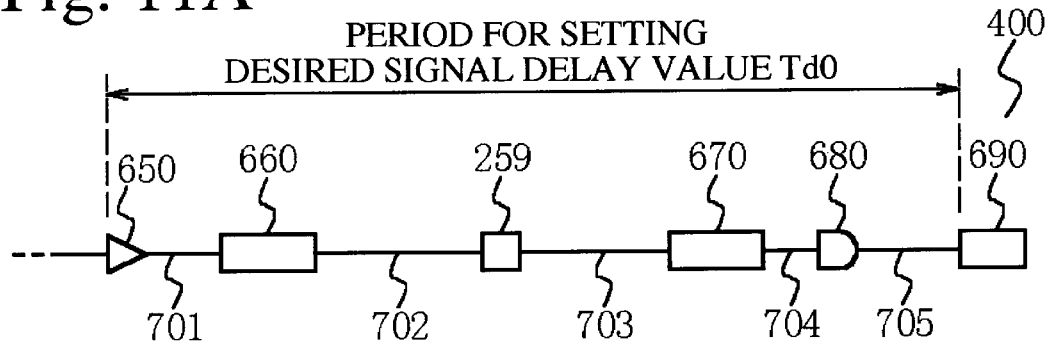
FIGS. 11A, 11B and 11C are diagrammatic block diagram of a first signal path.

Next, a specific procedure of this design method will be described with reference to FIGS. 11A, 11B and 11C, which are diagrammatic block diagram of the first signal path, required to have the signal delay time within a predetermined error range from a desired signal delay time, for illustrating the process of the second embodiment of the LSI design method in accordance with the present invention. Since a fundamental principle of the LSI design method of this embodiment is the same as that of the LSI design method of the first embodiment, explanation of a common portion will be omitted.

Here, assuming that the signal delay time of the first signal path is "td0", the predetermined desired signal delay value is "Td0", the first standardized value is "ta1", and the error (which is the second standardized value) is "ta0" (<ta1), it is assumed that the signal delay time of the first signal path fulfills the following relation:

Td0−ta0·td0·Td0+ta0

First, in the library preparation step S11, similarly to the first embodiment of the LSI design method, one or more delay adjusting block groups each including a plurality of BFBs having different signal delay values, required for design of a desired LSI, are designed, and registered in a predetermined circuit library which already includes the other necessary information. Here, by replacing "tsk" and "tske0" in the first embodiment of the LSI design method with "2ta0" and "2ta1", the library preparation step S11 is the same as the library preparation step S10 in the first embodiment of the LSI design method, and therefore, further detailed explanation will be omitted.

Next, in the first circuit design step S21, the circuit design of the LSI realizing a desired function is carried out by using the circuit library thus prepared. At this time, a first BFB having a predetermined signal delay value is selected from a delay adjusting block group (identified by giving the reference number "250" here) having a maximum delay adjusting amount "tcrmax1" larger than the first standardized value "ta1", and the selected first BFB is inserted into a first signal path (identified by giving the reference number "400" here) including cascade-connected circuit blocks 650, 660, 670, 680 and 690 as shown in FIG. 11A, so that the first circuit connection information of the LSI is generated. Here, it is assumed that the delay adjusting block group 250 includes a number of BFBs . . . , 255, . . . , 259, . . . having different delay values, and the BFB 259 having a maximum signal delay value "Tbmax" within the delay adjusting block group 250 is selected as the first BFB. Here, it is assumed that a logic verification and a timing verification have already been completed at a conventional circuit connection information level, similarly to the first embodiment of the LSI design method.

In the first layout step S31, the placement and routing are carried out on the basis of the circuit library and the first circuit connection information to generate a first layout information. At this time, the circuit blocks 650, 660, 670, 680 and 690 of the first signal path 400 and the inserted first BFB 259 are interconnected by inter-block connecting wiring conductors 701 to 705. FIG. 11A shows the block diagram of the first signal path 400 obtained at this time.

In the actual routing delay simulation step S41, an actual routing delay simulation of the LSI concerned is carried out on the basis of parameters extracted from the circuit library, the first circuit connection information and the first layout information, and then, in the delay information extraction step S51, the signal delay value information of each of paths including the first signal path 400 is extracted from the result of the simulation.

In the first delay confirmation step S61, the extracted signal delay value of each path is compared with the predetermined standardized value, and an absolute value of a difference between the first signal delay time "ts1" of the first signal path 400 and the desired signal delay value "Td0", is calculated and compared with the first standardized value "ta1", to discriminate whether or not there exists a timing error larger than the each standardized value.

In this first delay confirmation step S61, when the timing error is detected, the process goes into the first delay adjustment step (circuit connection information modification step) S71, in which in the path in which the error is detected, the replacement of the circuit block or the modification of the placement and routing is carried out to generate the second circuit connection information and the second layout information Here, however, the replacement of the first BFB 259 inserted in the first signal path 400 is not carried out, but modification is limited only to the replacement of the circuit blocks 650, 660, 670 and 680 and/or the placement and routing of the circuit blocks.

Thereafter, on the basis of the second circuit connection information and the second layout information thus generated, the actual routing delay simulation step S41, the delay information extraction step S51, and the first delay confirmation step S61 are repeated. In any case, until all the timing errors are canceled, a process composed of the first delay adjustment step S71, the actual routing delay simulation step S41, the delay information extraction step S51, and the first delay confirmation step S61 is repeated.

Figure 11B:
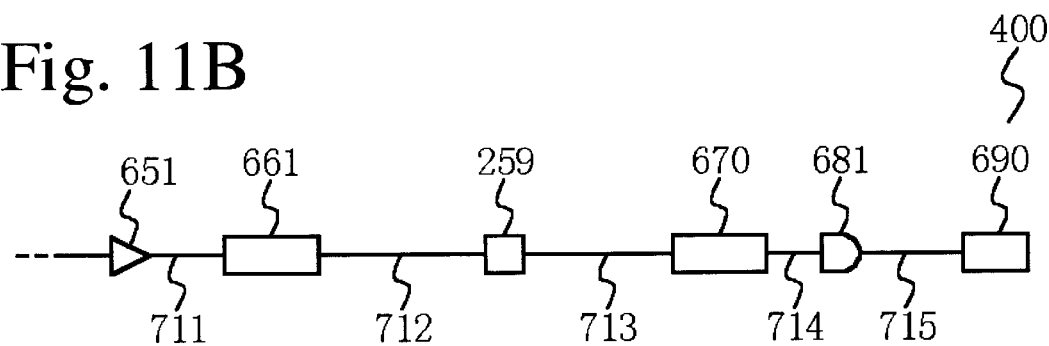
Figure 11C:
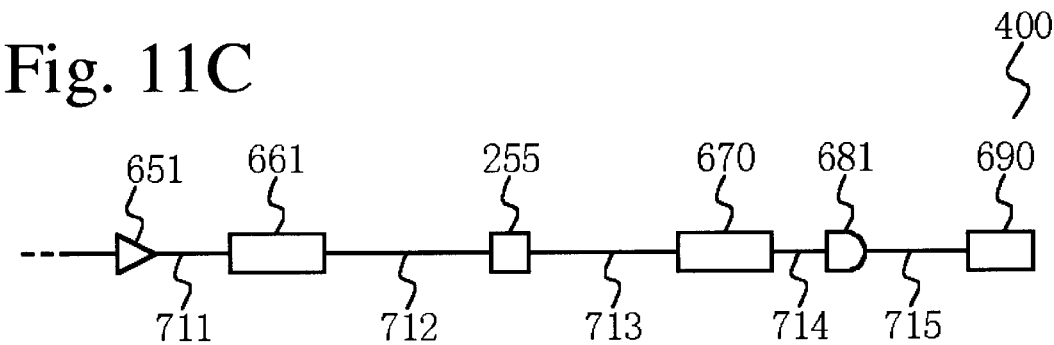

FIG. 11B illustrates the construction of the first signal path 400 when it is confirmed in the first delay confirmation step S61 that all the timing errors are canceled. As seen from comparison between FIGS. 11A and 11B the circuit blocks 650, 660 and 680 are changed to the circuit blocks 651, 661 and 681, respectively, and the inter-block connecting wiring conductors 701 to 705 are modified to inter-block connecting wiring conductors 711 to 715, respectively. Accordingly, until this point in time, the adjustment is carried out with no replacement of the first BFB 259.

In the second delay confirmation step S81, a difference between the first signal delay time "ts2" of the first signal path 400 extracted from the result of the actual routing delay simulation and the desired signal delay value "Td0" of the first signal path 400 is calculated to obtain {ts2−Td0}, and whether or not an absolute value of this difference {ts2−Td0}, greater than the second standardized value "ta0" (which is a predetermined error) is discriminated.

When the absolute value of this difference {ts2−Td0} is greater than the second standardized value "ta0", the process goes into the second delay adjustment step S91. In this second delay adjustment step S91, a second BFB 255 having the signal delay value "Tbs" which is the nearest to {Td0−ts2+Tbmax} is selected from the delay adjusting block group 250, and the first BFB 259 is replaced with the second BFB 255 to generate the third layout information. FIG. 9C illustrates the construction of the first signal path 400 when the second delay confirmation step S91 is completed.

Also in this embodiment, if the delay adjusting block group is prepared to fulfill a condition that the maximum delay adjusting amount "tcrmax1" is larger than double the first standard value "ta1", namely, "2ta1" and when one BFB is arbitrarily selected, there necessarily exists another BFB having such a relation that a difference between the signal delay value of the selected BFB and the signal delay value of the second BFB is not greater than double the second standardized value "ta0", namely, "2ta0", this process can make the absolute value of the difference between the signal delay time of the first signal path 400 and the desired signal delay value, not greater than the second standardized value "ta0".

Finally, in the final layout information generation step S100, for the third layout information thus generated, a predetermined design rule checking and others are carried out to generate a final layout information which is used for preparing reticles for the LSI fabrication or for an electron beam direct exposure.

Incidentally, in the second delay confirmation step S81, when the absolute value of this difference {ts2−Td0} is not greater than the second standardized value "ta0", the newest second layout information when the second delay confirmation step S81 is carried out is used without modification as the third layout information.

In the first and second embodiments of the LSI design method mentioned above, each of the BFBs included in the same delay adjusting block group is designed to be the same in connection with the shape, the size and the placement and routing inhibition region of the block, the shape, the size and the placement of the transistors included in the input part, the input terminal position, the input terminal capacitance, the shape, the size and the placement of the transistors included in the output part, the output terminal position, the driving capability including the load dependency, and the logic operation of the delay adjusting part. Therefore, unless the replacement of the BFB is carried out within the same delay adjusting block croup, no influence is given to the placement and routing of a peripheral circuit, and no influence is given to the actual routing simulation result of the clock path or the first signal path including the BFB concerned, in connection to a portion from the input of the clock path or the first signal path to the input of the BFB concerned, and in connection to another portion from the output of the BFB concerned to the output of the clock path or the first signal path. Accordingly, re-execution of the placement and routine of the LSI is no longer necessary, and re-execution of the actual routing delay simulation is also no longer necessary. In other words, it is sufficient if the signal delay value of the clock path or the first signal path is modified by a difference between the BFB to be removed and the BFB to be newly inserted in place of the BFB to be removed. Accordingly, it is possible to simply carry out a highly precise skew adjustment or a highly precise signal delay adjustment.

The invention has thus been shown and described with reference to the specific embodiments. However, it should be noted that the present invention is in no way limited to the details of the illustrated structures but changes and modifications may be made within the scope of the appended claims.

For example, in the first and second embodiments of the LSI design method as mentioned above, the maximum delay adjusting amount of the previously prepared delay adjusting block group is not smaller than the first standardized value, and only one predetermined BFB is inserted in each clock path or the first signal path. However, the maximum delay adjusting amount of the delay adjusting block group may be smaller than the first standardized value, and a plurality of BFBs may be inserted. If a plurality of BFBs are inserted, even if the maximum delay adjusting amount of the delay adjusting block group is smaller than the first standardized value, it is possible to carry out a necessary skew adjustment or a necessary signal delay adjustment.

Furthermore, when a plurality of BFBs are inserted, each of the plurality of BFBs may be included in the same delay adjusting block group, but may be included in different delay adjusting block groups having different changing rates of the delay value. In the latter case, it is possible not only to enlarge a delay adjusting range but also to ensure the precision of adjustment.

In addition, even an LSI simultaneously requiring both the clock skew adjustment and the delay value adjustment of a predetermined signal path, can be designed with no problem by simultaneously applying the first and second embodiments of the LSI design method as mentioned above.

As seen from the above, the buffer circuit block in accordance with the present invention is constituted to include the input part, the delay adjusting part and the output part and to be able to change the delay amount of the delay adjusting part within a predetermined range while maintaining at least the external shape and the external size of the block, the input terminal position and the output terminal position, the input terminal capacitance and the driving capability of the output part including the load dependency. Therefore, if the delay adjusting block group including a plurality of buffer circuit blocks having different signal delay values previously prepared, is registered into the circuit library, and at least one of the buffer circuit blocks is inserted into a necessary signal path, it is possible to replace the inserted buffer circuit block with another buffer circuit block included in the delay adjusting block group but having a different signal delay value, with giving no influence to peripheral circuit elements and/or interconnections after the layout is completed. Furthermore, the delay value adjustment of the signal path can be easily carried out by re-executing the delay simulation of the signal path concerned.

Furthermore, according to the LSI design method in accordance with the present invention using the above mentioned buffer circuit block, after the delay amount of the signal path including the inserted buffer circuit block in accordance with the present invention is adjusted to a predetermined level by an existing delay amount adjusting method without replacing the inserted buffer circuit block in accordance with the present invention, the delay amount of the signal path is further precisely adjusted by replacing the inserted buffer circuit block in accordance with the present invention by another buffer circuit block in accordance with the present invention A highly precise delay amount adjustment can be attained easily for a shortened time.

What is claimed is:

1. A buffer circuit block for use in a semiconductor integrated circuit, including:
   an input part;
   a delay adjusting part; and
   an output part, said delay adjusting part being coupled to said input part and said output part and causing a delay amount between said input part and said output part, wherein
      a delay amount of said delay adjusting part is able to be changed within a predetermined range while at least an input terminal capacitance of said input part having an input terminal and a driving capability of said output part including a load dependency remain constant, wherein said delay amount of said delay adjusting part is within said predetermined range while a placement and routing inhibition region remains constant, said placement and routing inhibition region being a predetermined area of the buffer circuit block where additional placement and routing of elements are inhibited.

2. The buffer circuit block of claim 1, wherein a first layout and routing pattern is associated with a first buffer circuit block, a second layout and routing pattern is associated with a second buffer circuit block, and said placement and routing inhibition region is determined in accordance with a union of said first and said second layout and routing patterns.

3. A buffer circuit block for use in a semiconductor integrated circuit including an input part, a delay adjusting part and an output part, each including a plurality of transistors, a delay amount of said delay adjusting part being able to be changed within a predetermined range while at least the position of an input terminal provided in said input part, the position of an output terminal provided in said output part, an external shape and an external size of the buffer circuit block, the shape and the size of said transistors included in said input part, and the shape and the size of said transistors included in said output part are constant, said delay adjusting part being coupled to said input part and said output part and causing said delay amount between said input part and said output part.

4. A buffer circuit block claimed in claim 3 wherein said delay amount of said delay adjusting part is within said predetermined range while a placement and routing inhibition region is constant, said placement and routing inhibition region being an area of said buffer circuit block where additional placement and routing of an element is inhibited.

5. A buffer circuit block claimed in claim 3 wherein said plurality of transistors included in said delay adjusting part include a plurality of transistors having the same conductivity type and having different driving capabilities.

6. A buffer circuit block claimed in claim 3 wherein said input part includes at least one unitary cell constituted of a p-channel field effect transistor and an n-channel field effect transistor, and said delay adjusting part includes a plurality of unitary cells each constituted of a p-channel field effect transistor and an n-channel field effect transistor.

7. A buffer circuit block claimed in claim 6 wherein said output part includes a plurality of parallel-connected unitary cells each constituted of a p-channel field effect transistor and an n-channel field effect transistor.

8. A method for designing a semiconductor integrated circuit which includes at least a clock signal driving circuit block, and a plurality of first circuit blocks operating in synchronism with a clock signal supplied from said clock signal driving circuit block, the method including:
   a library preparation step to previously prepare at least one delay adjusting block group including a plurality of buffer circuit blocks each of which includes an input part, a delay adjusting part and an output part, wherein each of said plurality of buffer circuit blocks in a same delay adjusting group block have a same input terminal capacitance of said input part, a same driving capability of said output part including a load dependency, and a same internal logical operation but each of said plurality of buffer circuit blocks have different signal delay values of said delay adjusting part, and then, to register said delay adjusting block group into a circuit library;
   a first circuit design step to select, when a circuit design of the semiconductor integrated circuit is carried out by using said circuit library, a first buffer circuit block having a predetermined signal delay value from said circuit library and to insert the selected first buffer circuit block into each clock path of a clock net for interconnecting at least said clock signal driving circuit block and said plurality of first circuit blocks, so as to generate a first circuit connection information of the semiconductor integrated circuit;
   a first layout step to execute placement and routing on the basis of said circuit library and said first circuit connection information to generate a first layout information;
   an actual routing delay simulation step to execute the actual routing delay simulation of the semiconductor integrated circuit by using a predetermined information including parameters extracted from said first layout information;
   a delay information extraction step to extract a signal delay value information of each of various paths of the LSI including said clock net, from the result of simulation obtained in said actual routing delay simulation step;
   a first skew confirmation step to compare the signal delay value of each clock path extracted in said delay information extraction step with a predetermined standardized value and to compare the skew of said clock net with a first predetermined standardized value so as to discriminate whether or not a timing error exists;
   when at least the skew of said clock net is larger than said first predetermined standardized value, a first skew adjustment step to modify the placement and routing of the circuit blocks included in said clock net and replace the circuit blocks included in said clock net excluding said first buffer circuit block with another, so as to generate a second circuit connection information and a second layout information;

until at least the skew of said clock net becomes not greater than said first standardized value, said first skew adjustment step, said actual routine delay simulation step, said delay information extraction step and said first skew confirmation step are repeated;

when the skew of said clock net becomes not greater than said first standardized value, a second skew confirmation step to compare the signal delay value of each of said clock paths included in said clock net extracted from the result of the actual routing delay simulation, with the signal delay value of a predetermined first clock path, to extract all second clock paths each having the signal delay value different from said signal delay value of said predetermined first clock path by a value larger than a second standardized value; and second skew adjustment step to select, for each of all said second clock paths, from said delay adjusting block group, a second buffer circuit block having a delay value sufficient to make the difference between the signal delay value of the second clock path concerned and said signal delay value of said predetermined first clock path, not larger than said second standardized value, to replace the first buffer circuit block in the second clock path concerned with the selected second buffer circuit block so as to generate a third layout information.

9. A method claimed in claim 8 wherein said plurality of buffer circuit blocks included in said delay adjusting block group are the same in connection with a routing inhibition region within each buffer circuit block.

10. A method claimed in claim 8 wherein said circuit library includes a plurality of delay adjusting block groups and a maximum signal delay value of the plurality of buffer circuit blocks included in the same delay adjusting block groups is different from one to another of said plurality of delay adjusting block groups.

11. A method claimed in claim 10 wherein, assuming that said maximum signal delay value and a minimum signal delay value of the plurality of buffer circuit blocks included in the same delay adjusting block groups are "tpdmax" and "tpdmin", respectively, said circuit library includes at least one delay adjusting block groups having a difference of {tpdmax−tpdmin} larger than said first standardized value.

12. A method for designing a semiconductor integrated circuit which includes a digital circuit required to have a first signal path having a signal delay time within a predetermined error range from a predetermined desired signal delay time, the method including:

a library preparation step to previously prepare at least one delay adjusting block group including a plurality of buffer circuit blocks each of which includes an input part, a delay adjusting part and an output part, wherein each of said plurality of buffer circuit blocks included in a same delay adjusting group block have a same input terminal capacitance of said input part, a same driving capability of said output part including a load dependency, and a same internal logical operation but each of said plurality of buffer circuit blocks have different signal delay values of said delay adjusting part, and then, to register said delay adjusting block group into a circuit library;

a first circuit design step to select, when a circuit design of the semiconductor integrated circuit is carried out by using said circuit library, a first buffer circuit block having a predetermined signal delay value from said circuit library to insert the selected first buffer circuit block into said first signal path so as to generate a first circuit connection information of the semiconductor integrated circuit;

a first layout step to execute placement and routing on the basis of said circuit library and said first circuit connection information to generate a first layout information;

an actual routing delay simulation step to execute the actual routing delay simulation of the semiconductor integrated circuit by using a predetermined information including parameters extracted from said first layout information;

a delay information extraction step for extracting a signal delay value information of each of various paths of the semiconductor integrated circuit including said first signal path, from the result of simulation obtained in said actual routing delay simulation;

a first delay confirmation step to compare the signal delay value of each path extracted in said delay information extraction step, with a predetermined standardized value, and to compare an absolute value of a difference between the signal delay path of said first signal path and said desired signal delay value, with a predetermined first standardized value so as to discriminate whether or not a timing error exists;

when said absolute value of said difference between the signal delay path of said first signal path and said desired signal delay value is larger than said a predetermined first standardized value, a first delay adjustment step to modify the placement and routing of the circuit blocks included in said first signal path or to replace said circuit blocks excluding said first buffer circuit block by another, so as to generate a second circuit connection information and a second layout information;

until said absolute value of said difference between the signal delay path of the first signal path and the desired signal delay value becomes not larger than said first standardized value, said first delay adjustment step, said actual routing delay simulation step, said delay information extraction step and said first delay confirmation step are repeated, when said absolute value of said difference between the signal delay path of the first signal path and the desired signal delay value becomes not larger than said first standardized value, a second delay confirmation step to discriminate whether or not said absolute value of said difference between the signal delay path of the first signal path and the desired signal delay value becomes not larger than a second standardized value; and when said absolute value of said difference between the signal delay path of the first signal path and the desired signal delay value becomes not larger than said second standardized value, a second delay adjustment step to select, from said delay adjusting block group including said first buffer circuit block on the first signal path, a second buffer circuit block having a delay value sufficient to make the absolute value of the difference between the signal delay value of the first signal path concerned and the desired signal delay value, not larger than said second standardized value, to replace said first buffer circuit block in said first signal path concerned with the selected second buffer circuit block so as to generate a third layout information.

13. A method claimed in claim 12 wherein said plurality of buffer circuit blocks included in said delay adjusting block group are the same in connection with a routing inhibition region within each buffer circuit block.

14. A method claimed in claim 12 wherein said circuit library includes a plurality of delay adjusting block groups and a maximum signal delay value of the plurality of buffer circuit blocks included in the same delay adjusting block groups is different from one to another of said plurality of delay adjusting block groups.

15. A method claimed in claim 14 wherein, assuming that said maximum signal delay value and a minimum signal delay value of the plurality of buffer circuit blocks included in the same delay adjusting block groups are "tpdmax" and "tpdmin", respectively, said circuit library includes at least one delay adjusting block groups having a difference of {tpdmax−tpdmin} larger than said first standardized value.

16. A buffer circuit block comprising:

an input part;

a delay adjusting part; and an output part having an output terminal, said delay adjusting part being coupled to said input part and said output part; and wherein said input part, said output part, and said delay adjusting part have an associated external shape and external size, said delay adjusting part including electrical components causing a delay amount between said input part and said output part, said delay amount being within a predetermined range wherein different delay amounts are associated with said delay adjusting part by changing a connection between at least a portion of said electrical components while said external shape, said external size, a position of said output terminal, a layout pattern of said input part and a layout pattern of said output part remain constant.

17. The buffer circuit block of claim 16, wherein said electrical components include at least one PMOS transistor and at least one NMOS transistor, a first configuration of said delay adjusting part includes at least one inverter formed by an NMOS transistor and PMOS transistor, and has a first delay amount, and a second configuration of said delay adjusting part includes said at least one inverter formed by said NMOS transistor and said PMOS transistor and has a second delay amount, and said first and said second delay amounts are determined by different internal connections associated with said NMOS transistor and said PMOS transistor.

18. A method of forming a buffer circuit block comprising:

providing an input part;

providing a delay adjusting part;

providing an output part having an output terminal, said delay adjusting part being coupled to said input part and said output part, and said input part, said output part, and said delay adjusting part have an associated external shape and external size, said delay adjusting part including electrical components causing a delay amount between said input part and said output part; and selecting said delay amount within a predetermined range associated with said delay adjusting part by varying a connection between at least a portion of said electrical components while said external shape, said external size, a position of said output terminal, a layout pattern of said input part and a layout pattern of said output part remain constant.

19. The method of claim 18, wherein said electrical components include at least one PMOS transistor and at least one NMOS transistor, a first configuration of said delay adjusting part includes at least one inverter formed by an NMOS transistor and PMOS transistor, and has a first delay amount, and a second configuration of said delay adjusting part includes said at least one inverter formed by said NMOS transistor and said PMOS transistor and has a second delay amount, and said first and said second delay amounts are determined by different internal connections associated with said NMOS transistor and said PMOS transistor.

* * * * *